(12) United States Patent
Kai

(10) Patent No.: US 6,230,244 B1
(45) Date of Patent: May 8, 2001

(54) MEMORY DEVICE WITH READ ACCESS CONTROLLED BY CODE

(75) Inventor: Nobuhiro Kai, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/087,902

(22) Filed: Jun. 1, 1998

(30) Foreign Application Priority Data

Jun. 12, 1997 (JP) .................................................... 9-154867
Apr. 23, 1998 (JP) .................................................. 10-113689

(51) Int. Cl.⁷ .................................................... G06F 12/00
(52) U.S. Cl. .............................. 711/164; 711/5; 711/103; 711/163; 711/152; 395/726; 395/728
(58) Field of Search ................................ 711/5, 103, 104, 711/105, 152, 163, 164; 395/728, 726

(56) References Cited

U.S. PATENT DOCUMENTS

| | | | |
|---|---|---|---|
| 4,999,770 | * | 3/1991 | Ara et al. ............................. 711/156 |
| 5,237,668 | * | 8/1993 | Blandy et al. ........................... 711/2 |
| 5,319,765 | * | 6/1994 | Kimura ................................ 711/164 |
| 5,442,704 | * | 8/1995 | Holtey ..................................... 380/23 |
| 5,787,309 | * | 7/1998 | Greenstein et al. ................... 710/36 |

FOREIGN PATENT DOCUMENTS

| | | |
|---|---|---|
| 2-300834 | 12/1990 | (JP) . |
| 3-278151 | 12/1991 | (JP) . |
| 4-170793 | 6/1992 | (JP) . |
| 4-367045 | 12/1992 | (JP) . |
| 5-233843 | 9/1993 | (JP) . |
| 7-73033 | 3/1995 | (JP) . |
| 7-105696 | 4/1995 | (JP) . |
| 3-83491 | 3/1996 | (JP) . |

* cited by examiner

Primary Examiner—Than V. Nguyen
(74) Attorney, Agent, or Firm—Jones Volentine, LLC

(57) ABSTRACT

Read access to a memory device is controlled by comparing an input control code with a predetermined code stored in the memory device. The comparison is performed inside the memory device, and read access is enabled or disabled according to the result. The control code can be used to select one of several memory devices connected to a common bus, or to provide security for information stored in the memory device.

14 Claims, 31 Drawing Sheets

FIG. 4

| SECURITY DATA | GATE LEVELS ||  IN | OUT |
|---|---|---|---|---|
| | PTr1, NTr1 | PTr2, NTr2 | | |
| L | L | H | L | H |
| | | | H | L |
| H | H | L | L | L |
| | | | H | H |

FIG. 7

| CSB | AMP OUT | PTr(7d) | NTr(7c) | DOUT |
|-----|---------|---------|---------|------|
| L | L | OFF | OFF | HiZ |
| L | H | OFF | OFF | HiZ |
| H | L | OFF | ON | L |
| H | H | ON | OFF | H |

FIG. 10

| SECURITY DATA | THRESHOLD VOLTAGES | | IN | OUT |
|---|---|---|---|---|
| | NTr3 | NTr4 | | |
| L | HIGH | LOW | L | H |
| | | | H | L |
| H | LOW | HIGH | L | L |
| | | | H | H |

FIG. 12

| SECURITY DATA | THRESHOLD VOLTAGES | | | | IN | Y9 | OUT |
|---|---|---|---|---|---|---|---|
| | NTr5 | NTr6 | NTr7 | NTr8 | | | |
| L | LOW | HIGH | LOW | HIGH | L | L | H |
| | | | | | H | H | L |
| H | HIGH | LOW | | | L | H | L |
| | | | | | H | L | H |
| * | * | * | HIGH | LOW | * | * | H |

* DON'T CARE

FIG. 23

| SECURITY DATA | AN$_1$IN | D0AP | ANOUT |
|---|---|---|---|
| L | L | L | H |
| L | H | L | L |
| H | L | H | L |
| H | H | H | H |

FIG. 27

| AN$_1$IN | D0AP | D8AP | ANOUT |
|---|---|---|---|
| H | H | H | L |
| L | | | H |
| H | L | H | H |
| L | | | L |
| H | H | L | H |
| L | | | H |
| H | L | L | H |
| L | | | H |

| CSB | AMP OUT | PTr (7d) | NTr (7c) | DOUT/DIN |
|-----|---------|----------|----------|----------|
| L | L | OFF | OFF | HiZ |
| L | H | OFF | OFF | HiZ |
| H | L | OFF | ON | L |
| H | H | ON | OFF | H |

MEMORY DEVICE WITH READ ACCESS CONTROLLED BY CODE

FIELD OF THE INVENTION

BACKGROUND OF THE INVENTION

The present invention relates to a memory device in which read access is controlled by the input of a code.

DESCRIPTION OF THE RELATED ART

This invention is applicable to, for example, various types of read-only memory (ROM), including both mask-programmable and electrically programmable ROM devices. ROM devices conventionally employ a two-line output control scheme in which read access is controlled by a chip enable signal and an output enable signal. When multiple ROM devices are connected in parallel to a common address bus, all of the ROM devices receive the same output enable signal, but each ROM device receives a different chip enable signal, which is generated by the decoding of address signals.

One disadvantage of this two-line control scheme is that an external address decoder is needed to generate the chip enable signals, and each chip enable signal requires a separate signal line. These requirements add to system size and cost.

Another disadvantage is that the size of the memory address space is limited by the number of address signal lines. Since each address selects a particular ROM device, it is not possible to re-use the same address in different ROM devices.

A further disadvantage is that any external device can read the memory contents, simply by driving two control signals to known active logic levels. There are situations in which access to the data stored in a memory device needs to be restricted. One example is the need to assure the security of confidential information stored in a read-only memory embedded in a smart card. Conventional memory devices lack an independent security protection function, making their data inherently vulnerable to unauthorized access.

SUMMARY OF THE INVENTION

It is accordingly an object of the present invention to enable read access to a plurality of memory devices to be controlled without requiring a separate chip enable signal for each device.

Another object of the invention is to expand memory address space.

A further object is to protect memory contents from undesired read access.

A memory device of a preferred embodiment has a memory cell array with memory cells for storing data, a code input circuit for receiving a control code, a comparing circuit for comparing the control code with a predetermined code, and a read control circuit for controlling read access to the data stored in the memory cells according to the result of the comparison. Read access is controlled by, for example, enabling or disabling an address decoding circuit, an output buffer circuit, or a sense-amplifier circuit.

The control code is preferably input on address signal lines, a mode signal being used to distinguish between control code input and address input.

The predetermined code is preferably programmed into the memory device by the same method as used to program data into the memory cells. Mask programming or electrical programming can be employed. The predetermined code can be stored in special memory cells in the memory cell array.

BRIEF DESCRIPTION OF THE DRAWINGS

In the attached drawings:

FIG. 4 is a table illustrating the operation of the programmable comparator in FIG. 3;

FIG. 7 is a table illustrating the operation of the circuit in FIG. 6;

FIG. 10 is a table illustrating the operation of the programmable comparator in FIG. 9;

FIG. 12 is a table illustrating the operation of the programmable comparator in FIG. 11;

FIG. 23 is a table illustrating the operation of the code comparator in FIG. 22;

FIG. 27 is a table illustrating the operation of the code comparator in FIG. 26;

DETAILED DESCRIPTION OF THE INVENTION

Figure 1:
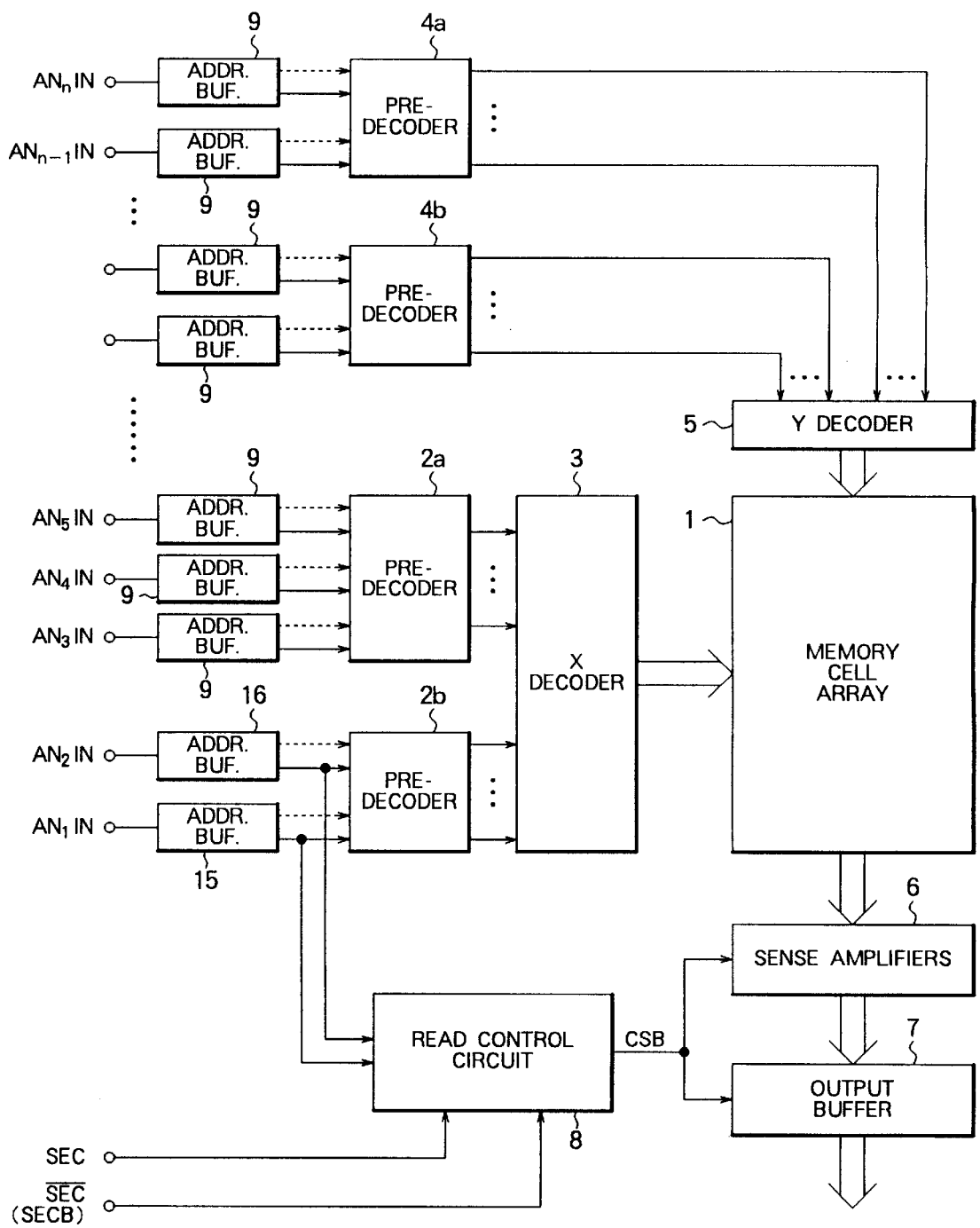
FIG. 1 is a block diagram of a mask-programmable ROM device, illustrating a first embodiment of the invention.

Embodiments of the invention will be described with reference to the attached illustrative drawings. Identical elements appearing in different embodiments will be indicated by the same reference numerals. Reference numerals with attached prime symbols or other suffixes will be used to indicate elements that are generally similar but not identical.

Referring to FIG. 1, the first embodiment is a mask-programmable ROM having a memory cell array 1 comprising a grid of word lines, which extend horizontally in the drawing, and bit lines, which extend vertically. The bit lines include data bit lines, on which memory cells are disposed, and dummy bit lines not having memory cells. The word lines, bit lines, and memory cells are not explicitly shown.

The memory cell array 1 is programmed with data during the manufacturing process. Programming is accomplished by, for example, ion implantation through a mask into transistor channel regions of selected memory cells. The data thus stored in the memory cells cannot be altered.

The first embodiment has an address decoding circuit comprising pre-decoders 2a and 2b, an X decoder 3, additional pre-decoders 4a and 4b, and a Y decoder 5. Pre-decoders 2a and 2b supply decoded address signals to X decoder 3, causing X decoder 3 to select one of the word lines in the memory cell array 1. Pre-decoders 4a and 4b supply decoded address signals to Y decoder 5, causing Y decoder 5 to select one or more of the bit lines in the memory cell array 1. Data stored in the memory cells disposed on the selected word line generate data signals on the bit lines, which are amplified by a sense-amplifier circuit 6. The amplified data signals on the selected bit lines are supplied through an output buffer circuit 7 to external output terminals (not visible), from which the data can be read by an external device. The sense-amplifier circuit 6 and output buffer circuit 7 are controlled by a novel read control circuit 8.

Externally supplied address signals are received at address input terminals $AN_1IN$ to $AN_nIN$, latched by address buffer circuits 9, 15, and 16, and supplied to the pre-decoders 2a, 2b, 4a, and 4b. The address signals and signal lines will also be denoted $AN_1IN$ to $AN_nIN$ below. Address signals $AN_1IN$ and $AN_2IN$ are supplied to both pre-decoder 2b and the read control circuit 8. Address buffer circuits 15 and 16 thus function as a code input circuit.

The read control circuit 8 additionally receives a pair of complementary mode signals SEC and SECB. (SECB is also indicated in the drawings as SEC with an overbar). The SEC and SECB input terminals constitute a mode input circuit. These mode signals select the control-code input mode, SEC being active high and SECB active low.

The memory cell array 1 is managed in segments selected by the pre-decoders 2a and 4a according to the address signals received by these pre-decoders. More precisely, pre-decoders 2a and 4a select segments of the X decoder 3 and Y decoder 5, as will be explained in a later embodiment.

The sense-amplifier circuit 6 and output buffer circuit 7 are activated only when a control signal (CSB) output by the read control circuit 8 is active. In the following description, CSB is active at the high logic level. The sense-amplifier circuit 6 and output buffer circuit 7 are disabled when CSB is low.

Figure 2:
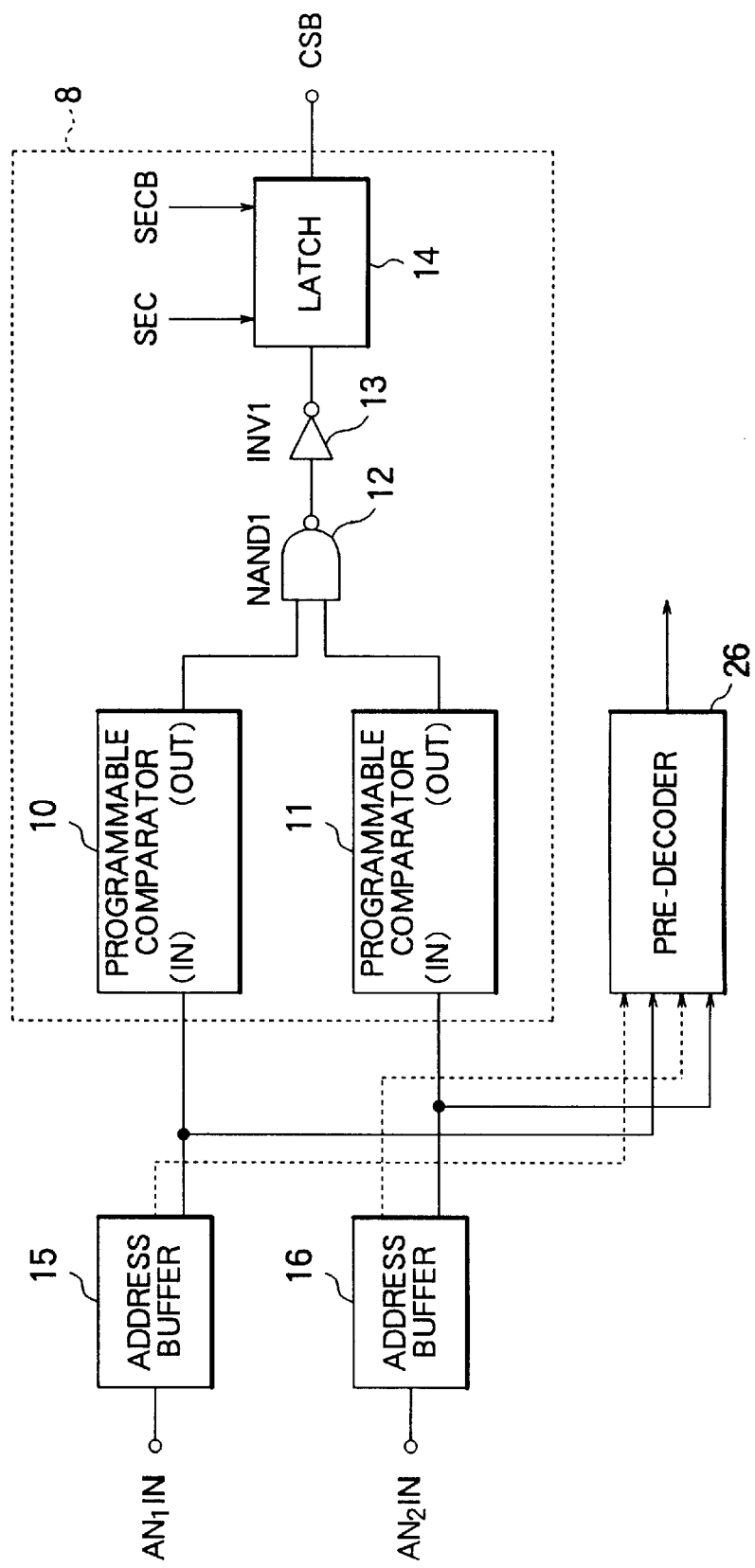
FIG. 2 is a more detailed block diagram of the read control circuit in FIG. 1.

Referring to FIG. 2, the read control circuit 8 has a pair of programmable comparators 10 and 11 that receive address bits $AN_1IN$ and $AN_2IN$ from address buffer circuits 15 and 16, a NAND gate (NAND1) 12 that operates on the outputs of the programmable comparators 10 and 11, an inverter (INV1) 13 that inverts the output of the NAND gate 12, and a latch 14 that stores the output of the inverter 13. The programmable comparators 10 and 11, NAND gate 12, and inverter 13 function as a comparing circuit, while the latch 14 functions as a control circuit.

The programmable comparators 10 and 11 compare address signals $AN_1IN$ and $AN_2IN$ with pre-programmed values. NAND gate 12 and inverter 13 produce a comparison result signal equal to the logical AND of the outputs of the programmable comparators 10 and 11. The latch 14 stores this comparison result signal at times determined by the mode signals SEC and SECB. Storing takes place only when SEC is high and SECB is low. The output of the latch 14 is the control signal CSB. Once SEC goes low and/or SECB goes high, the CSB output is held unchanged until SEC goes high and SECB goes low again, or until power is switched off.

Figure 3:
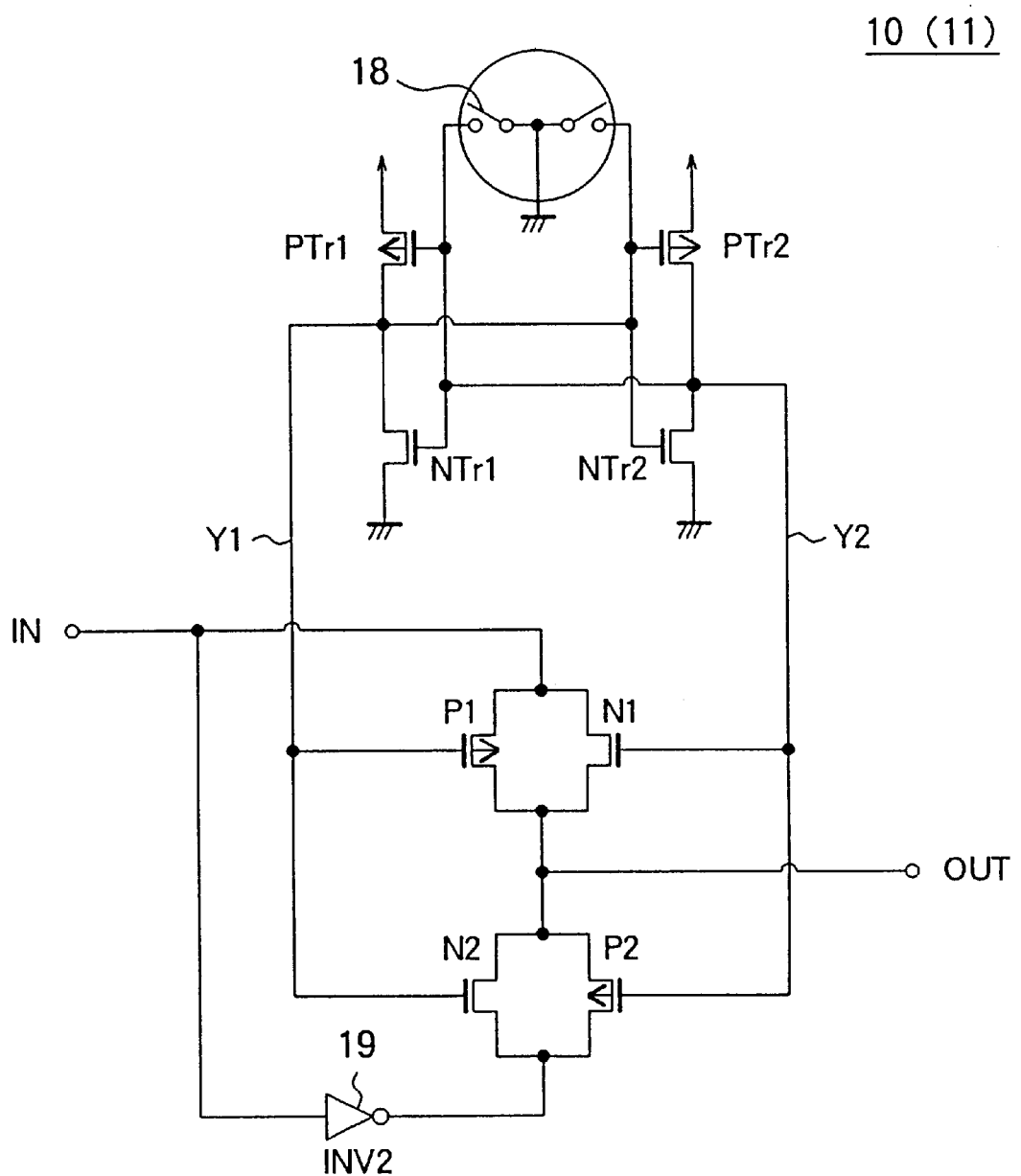
FIG. 3 is a circuit diagram of one of the programmable comparators in FIG. 2.

Each of the two programmable comparators 10 and 11 has the internal structure shown in FIG. 3. A pair of p-channel transistors PTr1 and PTr2 are coupled in series with respective n-channel transistors NTr1 and NTr2 between respective power-supply nodes, indicated by upward-pointing arrows, and ground nodes, indicated by ground symbols. A mask-programmable switch 18 grounds the gate terminals of either transistors PTr1 and NTr1, or transistors PTr2 and NTr2. Transistors PTr1, NTr1, PTr2, and NTr2 are cross-coupled so as to generate a pair of complementary signals Y1 and Y2. The switch 18 and transistors PTr1, NTr1, PTr2, and NTr2 constitute a selecting circuit that enables one of two transmission gates, as described below.

Signal Y1 is supplied to the gate terminals of a p-channel transistor P1 and an n-channel transistor N2, while Y2 is supplied to the gate terminals of another p-channel transistor P2 and another n-channel transistor N1. Transistors P1 and N1 are coupled in parallel, forming a transmission gate between an input terminal IN and an output terminal OUT. Transistors P2 and N2 are similarly coupled in parallel, forming a transmission gate between the output terminal OUT and the output terminal of an inverter (INV2) 19, which inverts the signal received at the input terminal IN.

The switch 18 is programmed with security data, forming one bit of a predetermined code, by a mask option during the manufacturing process. Security data values will be represented by the letters H (high) and L (low) below. The letters H and L will also be used to represent the high and low logic levels of address signals and other signals.

One mask option (security data L) causes switch 18 to ground the gate terminals of transistor PTr1, which is thereby switched on, and transistor NTr1, which is thereby switched off. Signal Y1 is accordingly high, switching transistor PTr2 off and transistor NTr2 on, and making signal Y2 low. As a result, the transmission gate comprising transistors P1 and N1 is disabled (transistors P1 and N1 are switched off), and the transmission gate comprising transistors P2 and N2 is enabled (transistors P2 and N2 are switched on).

The other mask option (security data H) leads to the opposite operation, in which transistors PTr2, NTr1, P1, and N1 are switched on, and transistors PTr1, NTr2, P2, and N2 are switched off. The transmission gate comprising transistors P1 and N1 is now enabled, while the transmission gate comprising transistors P2 and N2 is disabled.

FIG. 4 summarizes the operations of the programmable comparators 10 and 11. With low (L) security data, the gate terminals of transistors PTr1 and NTr1 are low (L), the gate terminals of transistors PTr2 and NTr2 are high (H), and the T1993 logic level at the output terminal OUT is opposite to the logic level at the input terminal IN, because of the action of inverter 19. With high (H) security data, the gate terminals of transistors PTr1 and NTr1 are high (H), the gate terminals of transistors PTr2 and NTr2 are grounded and therefore low (L), and the logic level at the output terminal OUT is identical to the logic level at the input terminal IN.

The input logic level in FIGS. 3 and 4 is the logic level of address signal $AN_1IN$ in programmable comparator 10, and of address signal $AN_2IN$ in programmable comparator 11. These signals $AN_1IN$ and $AN_2IN$ accordingly function not only as address signals, but also as a control code that is compared by programmable comparators 10 and 11 with the predetermined code programmed by the security data. FIG. 4 indicates that the output of each programmable comparator is high when the input signal ($AN_1IN$ or $AN_2IN$) matches the corresponding bit of the predetermined code (the security data bit), and low when the input signal does not match the predetermined code.

Figure 5:
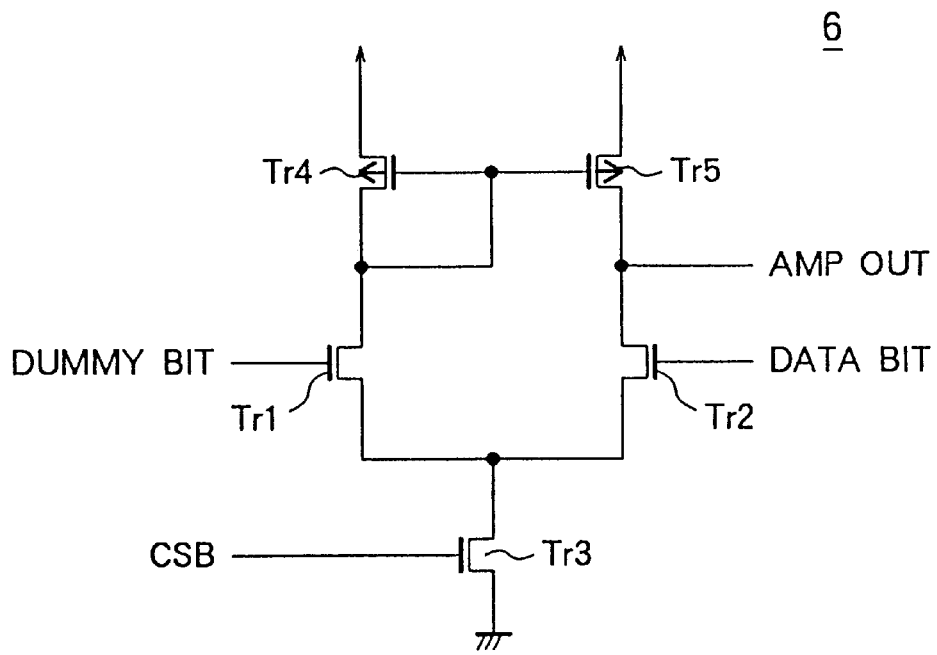
FIG. 5 is a circuit diagram of a sense amplifier in the sense-amplifier circuit in FIG. 1.

FIG. 5 shows the circuit configuration of one of the sense amplifiers in the sense-amplifier circuit 6. One sense amplifier of this type is coupled to each data bit line in the memory cell array 1. Each sense amplifier is also coupled to a dummy bit line that is held at a fixed potential. The sense amplifier comprises n-channel transistors Tr1, Tr2, and Tr3, and p-channel transistors Tr4 and Tr5. The dummy bit line, data bit line, and CSB signal line are coupled to the gate terminals of transistors Tr1, Tr2, and Tr3, respectively. The gate terminals of transistors Tr4 and Tr5 are both coupled to the drain terminals of transistors Tr1 and Tr4, which are mutually interconnected. An amplified output signal (AMP OUT) is taken from the drain terminals of transistors Tr2 and Tr5, which are likewise mutually interconnected.

When the control signal CSB is high, a constant current flows from the power supply to ground through transistors Tr4, Tr1, and Tr3, fixing the gate voltage of transistors Tr4 and Tr5 at a value that makes these two transistors function as load elements for transistors Tr1 and Tr2. The amplified output signal then has a logic level opposite to the level of the data bit line. When control signal CSB is low, no current flows through the sense amplifier, and the amplified output signal does not respond to the logic level of the data bit line.

Figure 6:
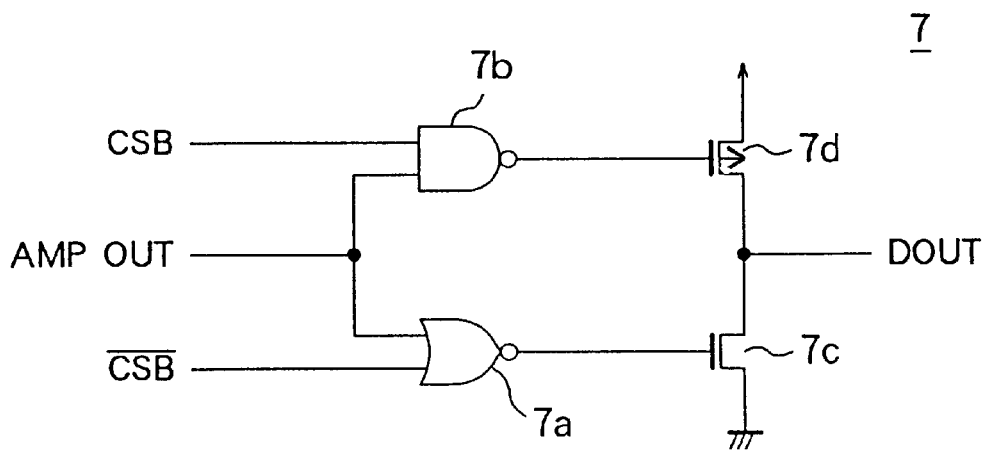
FIG. 6 is a circuit diagram of one part of the output buffer circuit in FIG. 1.

FIG. 6 shows the circuit configuration of a one-bit portion of the output buffer circuit 7, comprising a NOR gate 7a, a NAND gate 7b, an n-channel driving transistor 7c, and a p-channel driving transistor 7d. NAND gate 7b receives the control signal CSB from the read control circuit 8, while NOR gate 7a receives a complementary control signal (CSB-bar). CSB-bar is generated from CSB by an inverter not shown in the drawings. Both NOR gate 7a and NAND gate 7b receive the amplifier output signal (AMP OUT) from a selected sense amplifier. NOR gate 7a drives the gate terminal of transistor 7c, while NAND gate 7b drives the gate terminal of transistor 7d. Transistors 7c and 7d are coupled in series between the power supply and ground, and have interconnected drain terminals, from which a data output signal DOUT is taken.

Referring to FIG. 7, when the control signal CSB is high, the data output signal DOUT has the same high or low logic level as the amplifier output signal AMP OUT. When the control signal CSB is low, transistors 7c and 7d are both switched off, placing the output buffer in the high-impedance (HiZ) state. It is accordingly possible to detect whether the reading of data is enabled or not by detecting whether or not the output terminals are in the high-impedance state.

Next, the operation of the first embodiment will be described.

When the memory device is manufactured, a predetermined code is programmed by mask options into the programmable comparators 10 and 11, as described above.

When the memory device is powered on, the CSB output of latch 14 is initially low, disabling the operation of the sense-amplifier circuit 6 and placing the output buffer circuit 7 in the high-impedance output state. In this initial state, none of the data stored in the memory cell array 1 can be read.

To enable the stored data to be read, an external device must place a control code matching the predetermined code on the $AN_1IN$ and $AN_2IN$ address signal lines, drive the mode signals to their active levels (SEC high and SECB low), then drive one or, preferably, both of the mode signals to their inactive levels (SEC low and SECB high). These operations cause the latch 14 to store a high comparison result signal, received from inverter 13, indicating that the control code matched the predetermined code. Thereafter, latch 14 outputs a high control signal CSB, enabling the sense-amplifier circuit 6 and output buffer circuit 7.

To read data, the external device then supplies address signals on the address signal lines $AN_1IN$ to $AN_nIN$, keeping the mode signals inactive (SEC low and SECB high) so that the $AN_1IN$ and $AN_2IN$ inputs do not alter the content of the latch 14. CSB thus remains high, and the data stored in the addressed memory cells are output through the sense-amplifier circuit 6 and output buffer circuit 7.

After thus enabling read access to the memory device, the external device can later disable read access by placing a control code not matching the predetermined code on address signal lines $AN_1IN$ and $AN_2IN$, and driving the mode signals SEC and SECB first to their active levels, then to their inactive levels again. These operations cause the latch 14 to store a low comparison result signal output by inverter 13, and to output a low control signal CSB, disabling the sense-amplifier circuit 6 and output buffer circuit 7.

The reason for using two mode signals (SEC and SECB) with opposite active levels is to prevent unintended selection of the control-code input mode due to, for example, voltage noise on the mode signal lines.

One use of the first embodiment is to deter unauthorized access to the data stored in the ROM device. This purpose is accomplished by revealing the predetermined code only to authorized parties.

Figure 8:
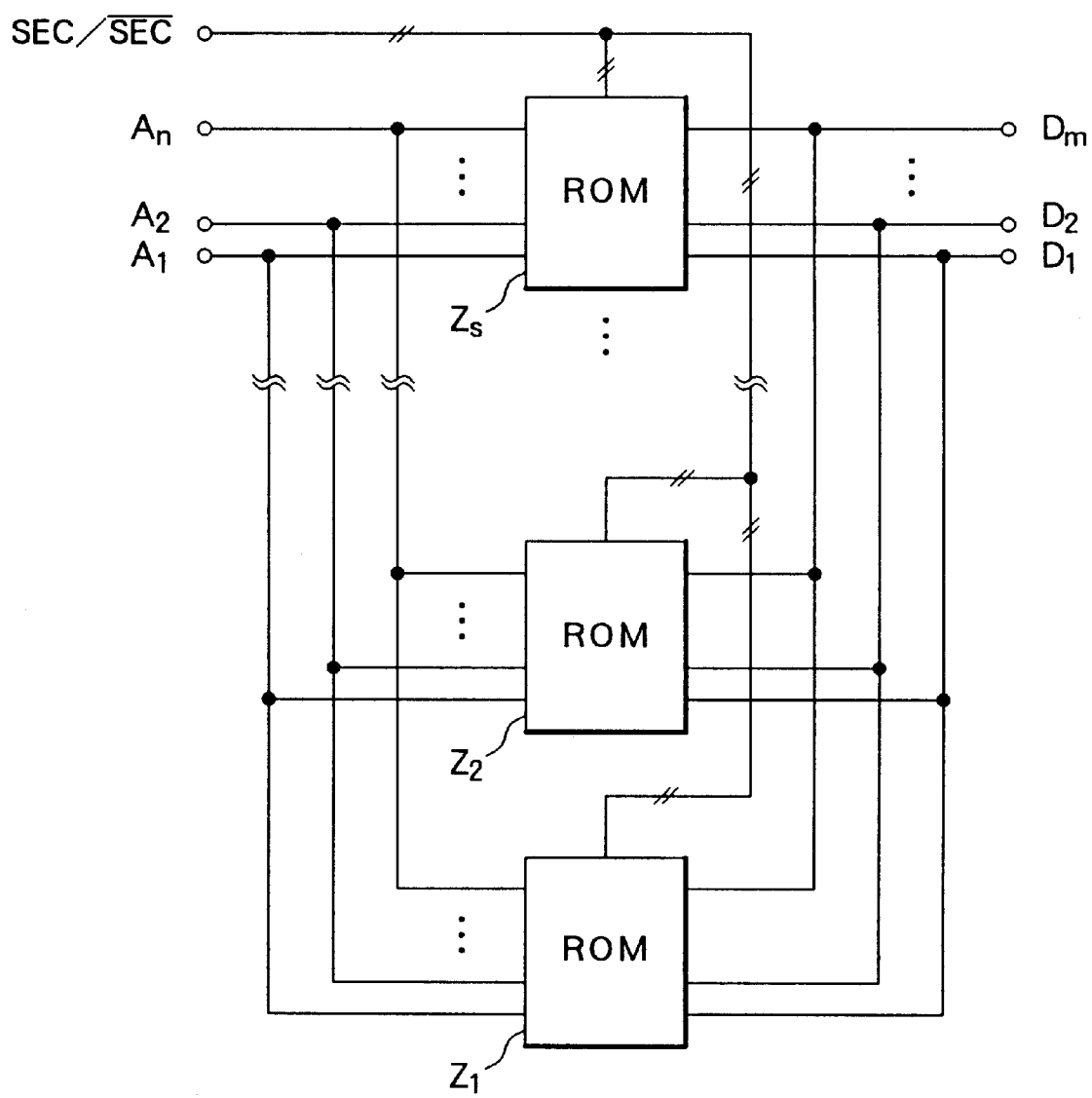
FIG. 8 is a block diagram illustrating a mode of usage of the first embodiment.

The first embodiment is also useful when it is necessary to select one of several ROM devices coupled in parallel to a common address bus. Referring to FIG. 8, the address bus comprises signal lines $A_1$ to $A_n$, which provide address input signals $AN_1IN$ to $AN_nIN$ to a plurality of ROM devices $Z_1$, $Z_2$, . . . , $Z_s$. The ROM manufacturer programs a different predetermined code into each of these ROM devices. The same address signals and mode signals (SEC and SECB) are supplied to all of the ROM devices.

To select, for example, ROM device $Z_1$, an external device places the predetermined code of ROM device $Z_1$ on address lines $A_1$ and $A_2$, and drives the mode signals SEC and SECB first to their active levels, then to their inactive levels. These operations cause the latch 14 in ROM device $Z_1$ to output a high CSB control signal, while the latches 14 in the other ROM devices $Z_2$, . . . , $Z_s$ output low control signals. Subsequently, when address signals are supplied, ROM device $Z_1$ outputs data from its memory cells, while the other ROM devices $Z_2$, . . . , $Z_s$ remain in the high-impedance output state.

By using address signals $A_1$ and $A_2$ to select a particular ROM device, the first embodiment allows the individual chip enable signals required by conventional ROM devices to be replaced by a single common pair of mode signal lines (SEC and SECB). Space is saved and costs are reduced because there is no need for an address decoder to generate separate chip enable signals for each ROM device. Memory address space is also expanded, because the same address can designate memory locations in different ROM devices, depending on the control code sent previously.

The number of address signal lines used for input of the control code can be increased from two to any greater number, up to the total number (n) of address signal lines, to obtain a higher level of security, or to enable more ROM devices to be coupled to the same address bus. It is only necessary to increase the number of programmable comparators in the read control circuit 8.

It is advantageous to supply the control signal CSB to both the sense-amplifier circuit 6 and the output buffer circuit 7, to avoid unnecessary current consumption when read access is disabled, but this is not strictly necessary. Read access can also be controlled by using CSB to control only the sense-amplifier circuit 6, or only the output buffer circuit 7. The chip size of the ROM device can be reduced in this way, because fewer CSB signal lines are required, and the total capacitive load that must be driven by the latch 14 can be reduced.

Next, a second embodiment will be described. The second embodiment differs from the first embodiment only in the circuit configuration of the programmable comparators, so the description will be confined to this point.

Figure 9:
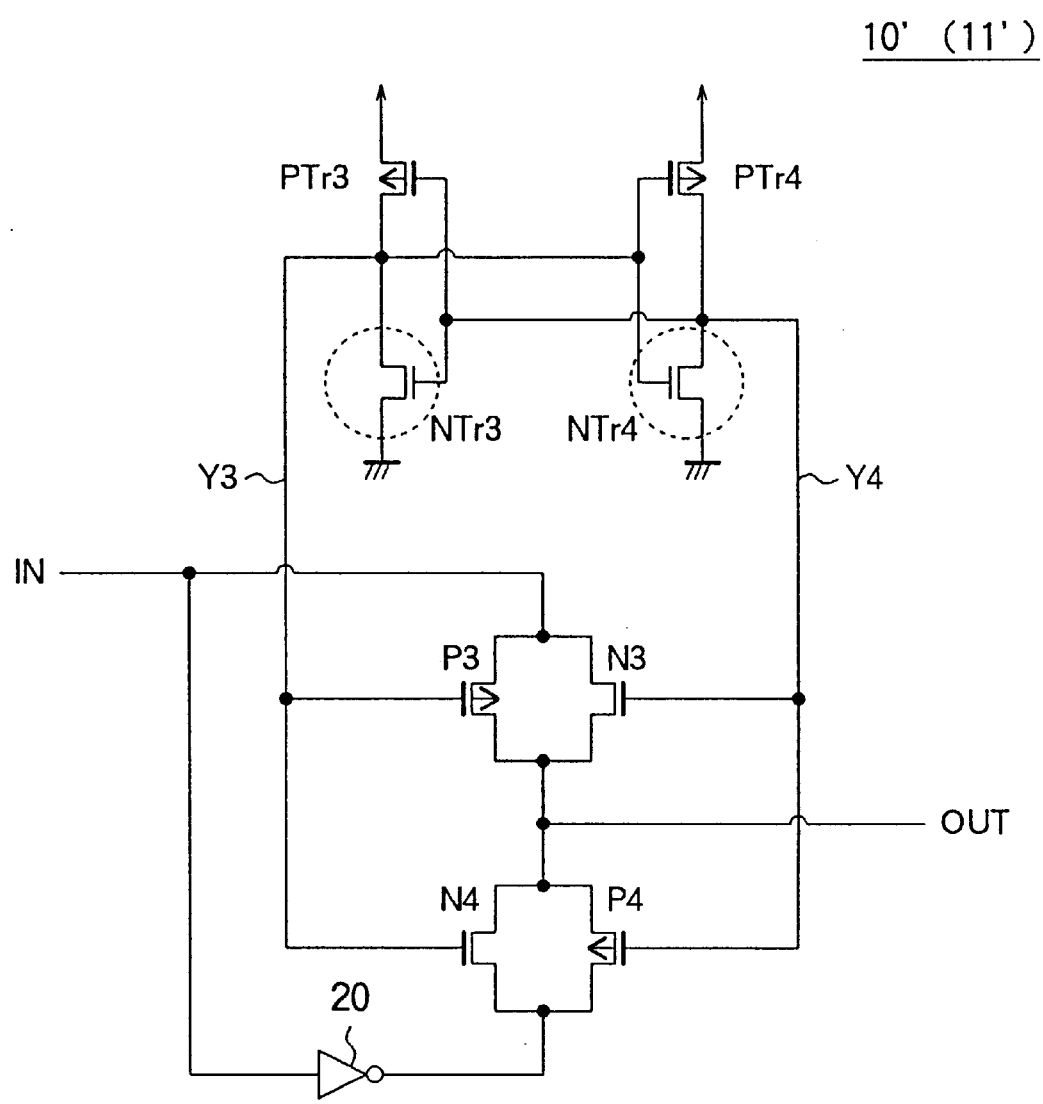
FIG. 9 is a circuit diagram of a programmable comparator used in a second embodiment of the invention.

Referring to FIG. 9, the programmable comparators 10' and 11' in the second embodiment have an inverter 20 corresponding to inverter 19 in the first embodiment (FIG. 3), and p-channel transistors PTr3, PTr4, P3, and P4 and n-channel transistors NTr3, NTr4, N3, and N4 interconnected in the same way as the corresponding transistors PTr1, PTr2, P1, P2, NTr1, NTr2, N1, and N2 in the first embodiment. In place of the mask-programmable switch 18 of the first embodiment, the second embodiment provides for transistors NTr3 and NTr4 to have different threshold voltages. The different threshold voltages can be created by, for example, a mask option causing ion implantation in the channel region of one of these two transistors NTr3 and NTr4 but not in the other. Electron acceptor ions can be implanted to raise the threshold voltage, or electron donor ions can be implanted to lower the threshold voltage.

If, for example, transistor NTr3 is given a higher threshold voltage than transistor NTr4, then when power is switched on, as the power-supply voltage rises, transistor NTr4 will begin to turn on before transistor NTr3. Signal Y4 will therefore be at a lower potential than signal Y3. The cross-coupling of transistors PTr3, NTr3, PTr4, and NTr4 causes signals Y3 and Y4 to diverge, so Y4 diverges toward the ground level (0 V), while Y3 diverges toward the power-supply level (e.g., 5 V). After a certain time, Y3 and Y4 will stabilize at the power-supply and ground levels, and subsequent operation will take place as in the first embodiment, with transistors P3 and N3 switched off and transistors P4 and N4 switched on.

Conversely, if the threshold voltage of transistor NTr3 is lower than the threshold voltage of transistor NTr4, then Y3 will diverge toward the ground level while Y4 diverges toward the power-supply level, and transistors P3 and N3 will be switched on while transistors P4 and N4 are switched off.

The programmable comparators in the second embodiment are programmed and operate as shown in FIG. 10. When the security data value specified as a mask option is low (L), transistor NTr3 is given a comparatively high threshold voltage, and transistor NTr4 is given a lower threshold voltage. When the security data value is high (H), transistor NTr3 is given a comparatively low threshold voltage, and transistor NTr4 is given a higher threshold voltage. As in the first embodiment, the output signal level is high when the input signal matches the security data, and low when the input signal does not match the security data.

The method of programming by using ion implantation to control the threshold voltages of transistors is widely employed in the mask programming of ROM devices. Compared with the first embodiment, the second embodiment has the advantage that the programmable comparators can be programmed with the same ion implantation mask as used for programming the data stored in the memory cells.

Next, a third embodiment will be described. The third embodiment differs from the first and second embodiments in providing a way to disable the read control function. The difference is embodied in the circuit configuration of the programmable comparators, and the description will be confined to this point.

Figure 11:
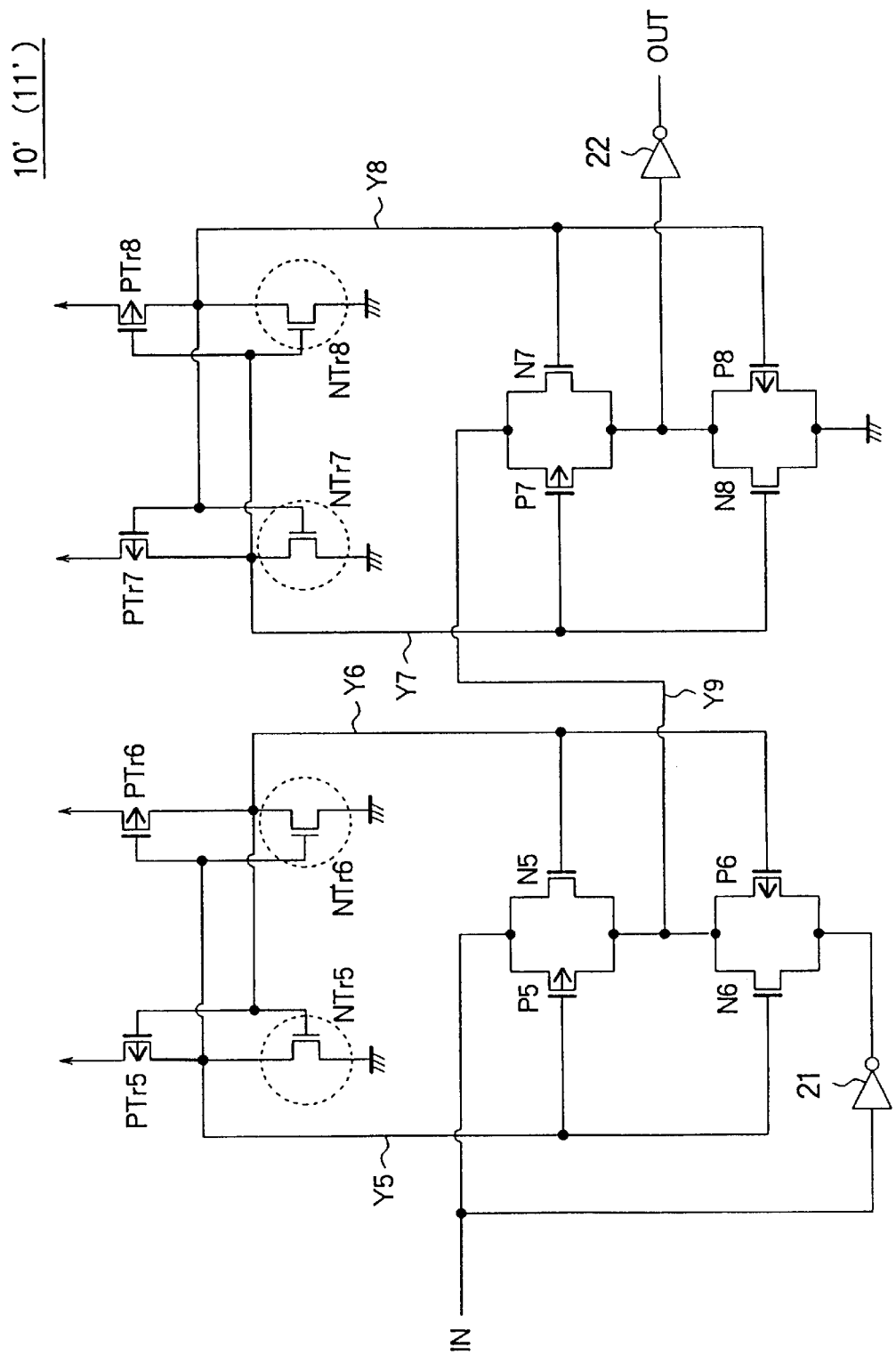
FIG. 11 is a circuit diagram of a programmable comparator used in a third and a fourth embodiment of the invention.

Referring to FIG. 11, the programmable comparators 10" and 11" in the third embodiment each have an inverter 21 corresponding to inverter 20 in the second embodiment (FIG. 9), and p-channel transistors PTr5, PTr6, P5, and P6 and n-channel transistors NTr5, NTr6, N5, and N6 interconnected in the same way as the corresponding transistors PTr3, PTr4, P3, P4, NTr3, NTr4, N3, and N4 in the first embodiment. The threshold voltages of transistors NTr5 and NTr6 are mask-programmable as in the second embodiment, producing a signal Y9 that is high or low depending on whether the input signal matches the programmed security data value.

In addition, each of the programmable comparators 10" and 11" in the third embodiment has a second set of p-channel transistors PTr7, PTr8, P7, and P8 and n-channel transistors NTr7, NTr8, N7, and N8, which are interconnected in an analogous fashion. The threshold voltages of transistors NTr7 and NTr8 are also mask-programmable. The above signal Y9 is provided as an input signal to the transmission gate comprising transistors P7 and N7. The input side of the other transmission gate, comprising transistors P8 and N8, is coupled to ground. An inverter 22 inverts the output logic level of these transmission gates to create the output signal (OUT).

When the read control function is used, the threshold voltages of transistors NTr5 and NTr6 are programmed according to FIG. 12, in a manner opposite to the programming in the second embodiment, and the threshold voltage of transistor NTr7 is programmed to be lower than the threshold voltage of transistor NTr8. When power is switched on, signal Y7 diverges toward the ground level while signal Y8 diverges toward the power-supply level, switching transistors P7 and N7 on and transistors P8 and N8 off. Signal Y9 has a logic level opposite to the output logic level in the second embodiment, because of the opposite programming of transistors NTr5 and NTr6. This logic level passes unchanged through transistors P7 and P8, but is then inverted by inverter 22, so the output signal OUT has the same value as in the second embodiment, going high to indicate agreement of the input signal with the security data value.

When the read control function is not used, the threshold voltage of transistor NTr7 is programmed to be higher than the threshold voltage of transistor NTr8. When power is switched on, signal Y7 diverges toward the power-supply level while signal Y8 diverges toward the ground level, switching transistors P7 and N7 off and transistors P8 and N8 on. Inverter 22 is coupled through transistors P8 and N8 to ground, so the output signal (OUT) is always high, regardless of the value of the input signal or the programming of transistors NTr5 and NTr6. The control signal CSB is therefore always high, enabling the sense-amplifier circuit 6 and output buffer circuit 7 to operate and the data stored in the memory cell array 1 to be read.

The third embodiment allows ROM devices with the read control function and ROM devices without the read control function to be manufactured and programmed in the substantially the same way, the only difference being in the programming of transistors NTr7 and NTr8. This feature is particularly useful when it is necessary to store the same data in both types of ROM devices.

Next, a fourth embodiment will be described. The fourth embodiment is identical to the third embodiment, except that a depletion-mode or DMOS ion implantation process is employed to program the programmable comparators.

The circuit configuration of the fourth embodiment is similar to that of the third embodiment, as shown in FIGS. 1 and 11. Referring to FIG. 11, if the DMOS ion implantation is carried out on transistors NTr6 and NTr7, then when power is switched on, these two transistors will be in a conducting state while transistors NTr5 and NTr8 are in a non-conducting state. Signals Y6 and Y7 will accordingly remain low, while signals Y5 and Y8 rise to the high level. Transistors P5, N5, P8, and N8 are therefore switched off, while transistors P6, N6, P7, and N7 are switched on. The circuit operates as indicated in FIG. 12 for the case of high security data, the input and output logic levels being identical.

ROM devices having their memory cells coupled to the bit lines in a NAND configuration are commonly programmed by DMOS ion implantation. The fourth embodiment uses the same DMOS ion implantation process to program the programmable comparators, which is an advantage to the memory manufacturer.

Next, a fifth embodiment will be described. The fifth embodiment differs from the first embodiment only in regard to the voltage applied to the gates of transistors PTr1, NTr1, PTr2, and NTr2 at power-up.

Figure 13:
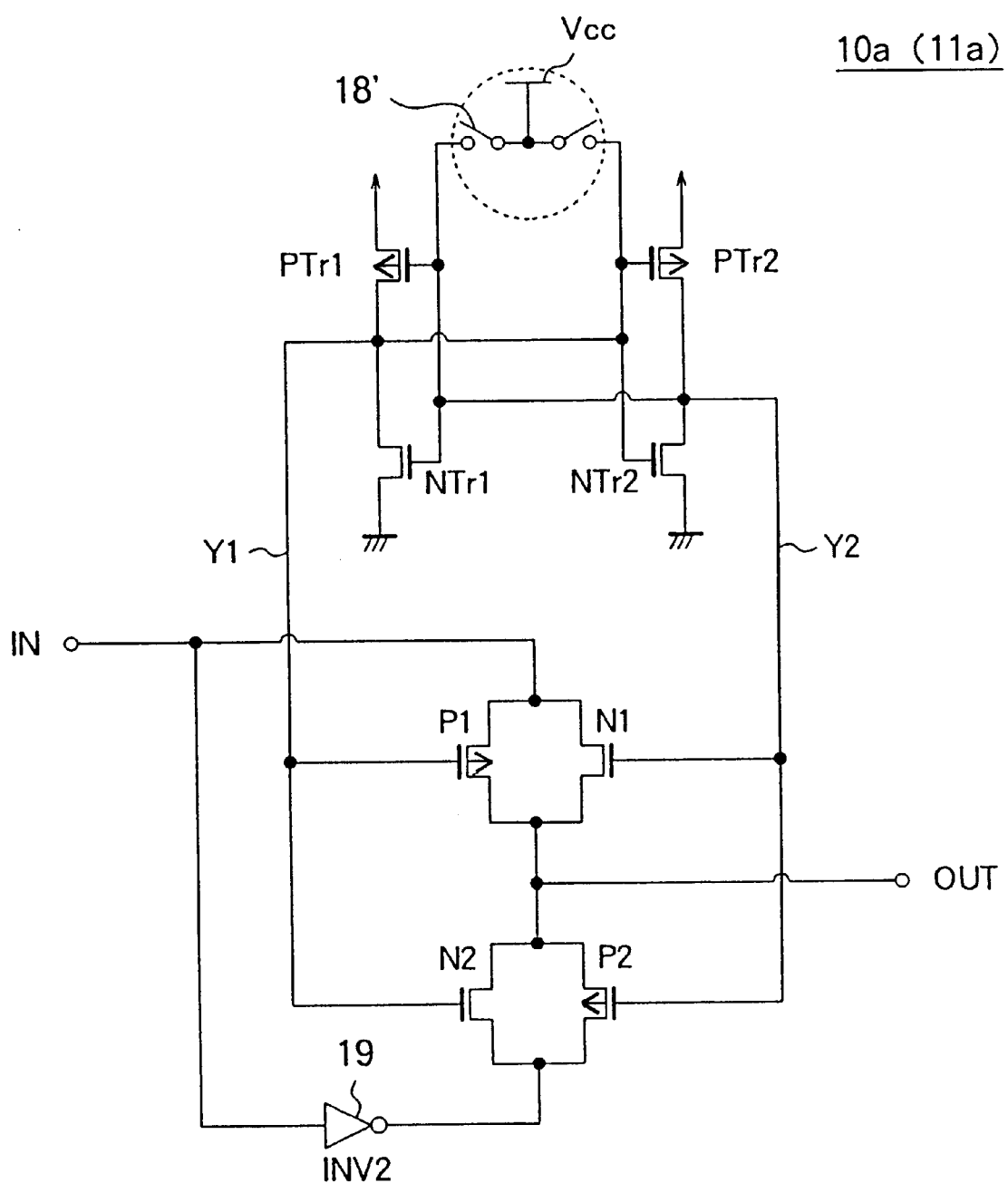
FIG. 13 is a circuit diagram of a programmable comparator used in a fifth embodiment of the invention.

Referring to FIG. 13, the programmable comparators 10a and 11a in the fifth embodiment have a mask-programmable switch 18' that couples the gate terminals of either transistors PTr1 and NTr1 or transistors PTr2 and NTr2 to the power supply. If, for example, switch 18' is programmed to couple the gate terminals of transistors PTr1 and NTr1 to the power supply, then when power is switched on, transistor PTr1 will remain off and transistor NTr1 will turn on. Signal Y1 will therefore remain low, so transistor PTr2 will turn on while transistor NTr2 remains off, causing signal Y2 to go high. Transistors P1 and N1 will accordingly be switched on, and transistors P2 and N2 will be switched off.

If switch 18' is programmed in the opposite manner, coupling the gate terminals of transistors PTr2 and NTr2 to the power supply, then signal Y1 will go high while signal Y2 remains low, switching transistors P1 and N1 off and transistors P2 and N2 on.

The fifth embodiment operates in substantially the same way as the first embodiment, and provides the same effects.

Next, a sixth embodiment will be described.

Figure 14:
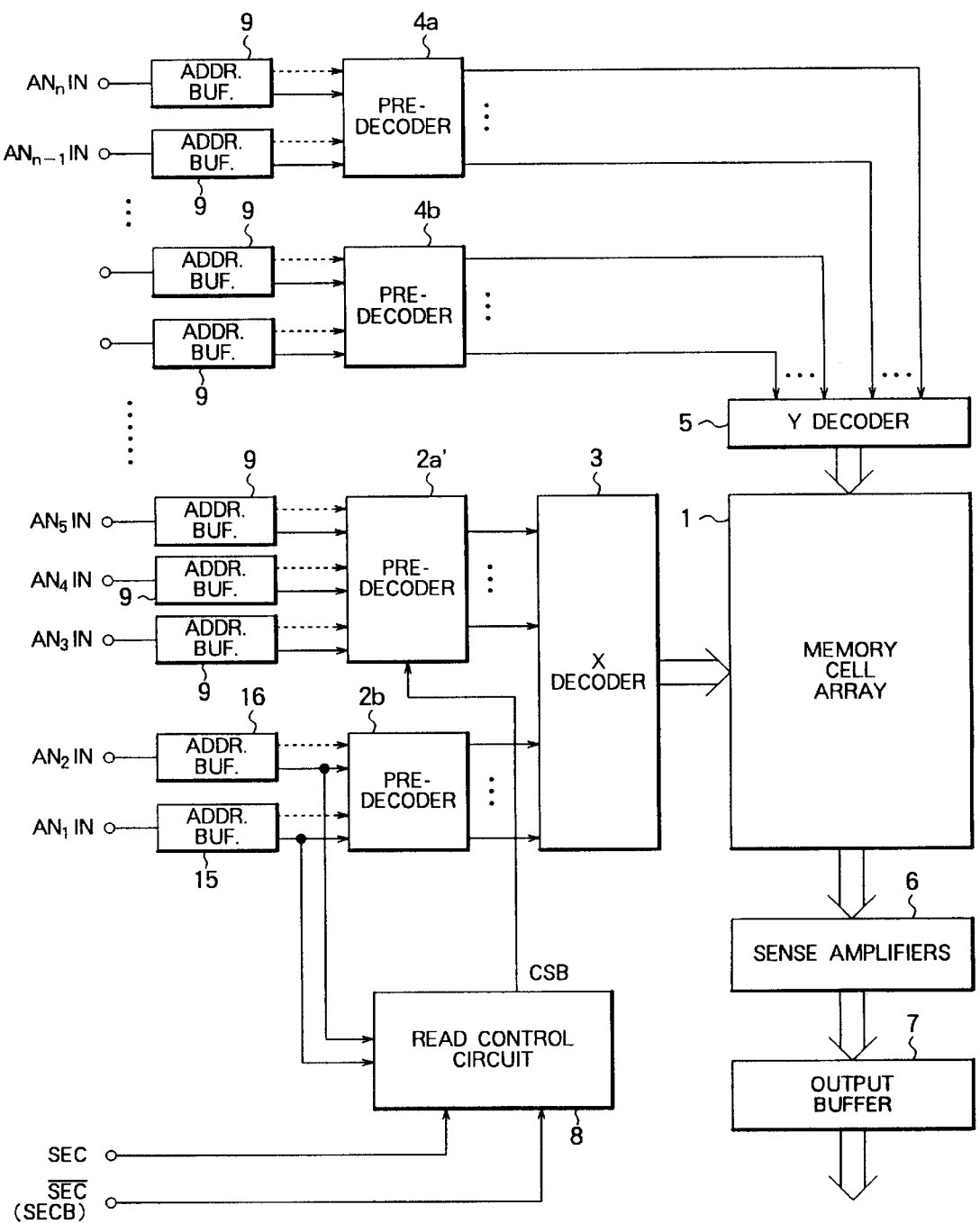
FIG. 14 is a block diagram of a mask-programmable ROM device illustrating a sixth embodiment of the invention.

FIG. 14 shows the block circuit configuration of the sixth embodiment. The difference between the first and sixth embodiments is that in the sixth embodiment, the control signal (CSB) output from the read control circuit 8 is supplied to pre-decoder 2a', instead of being supplied to the sense-amplifier circuit 6 and output buffer circuit 7. The internal structure of pre-decoder 2a' also differs from the structure of pre-decoder 2a in the first embodiment.

Figure 15:
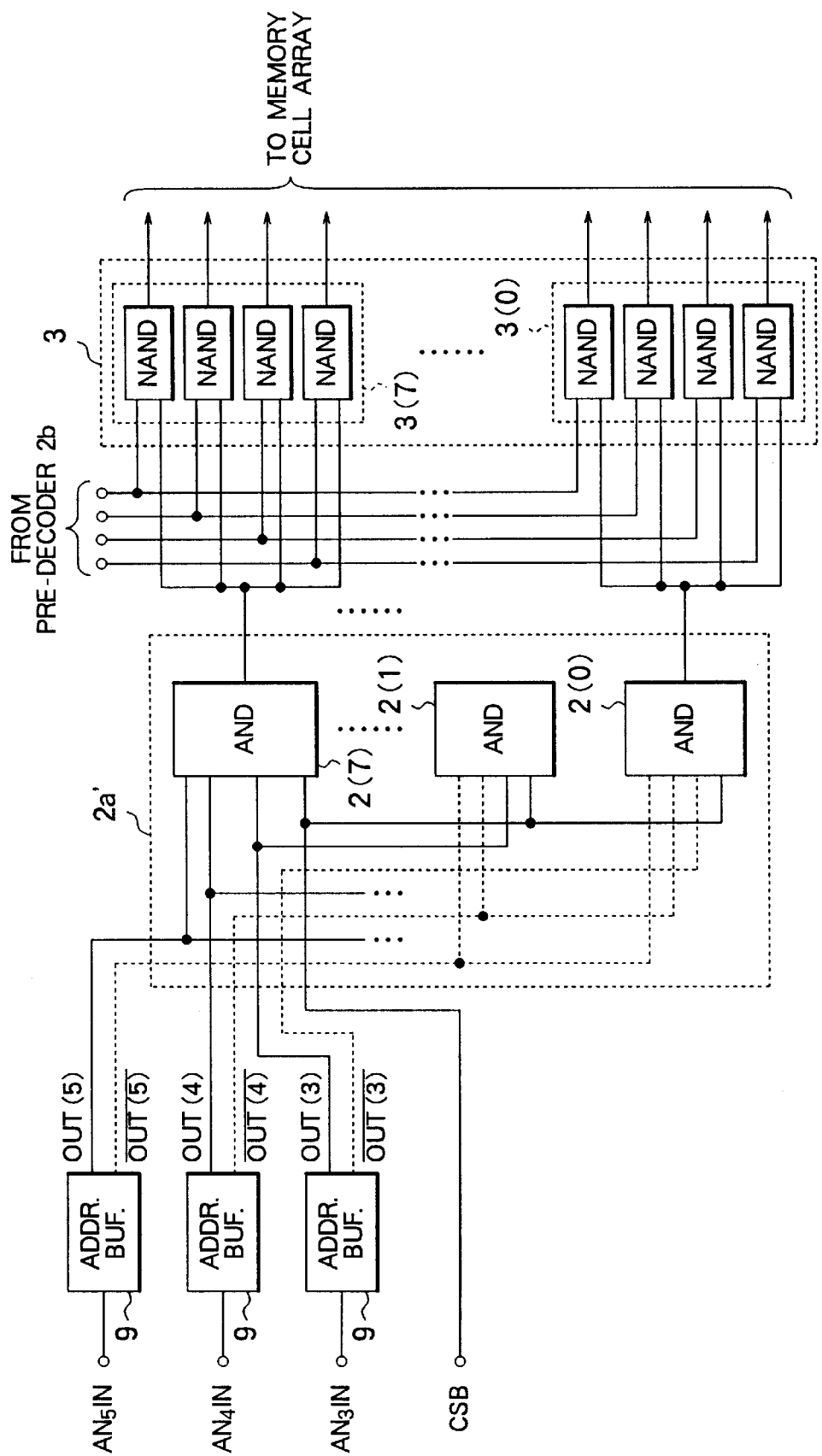
FIG. 15 is a more detailed block diagram of one of the pre-decoders in FIG. 14.

Referring to FIG. 15, pre-decoder 2a' comprises seven AND gates 2(0), 2(1), ..., 2(7), each having four input terminals. The control signal CSB is supplied to one input terminal of each of these AND gates. The other three input terminals of each AND gate are coupled to the three address buffers 9 that receive address signals AN$_3$IN, AN$_4$IN, and AN$_5$IN. These three address buffers produce respective output signals OUT(3), OUT(4), and OUT(5) having the same logic levels as AN$_3$IN, AN$_4$IN, and AN$_5$IN, and complementary signals OUT(3)-bar, OUT(4)-bar, and OUT(5)-bar having the opposite logic levels.

Each AND gate receives a different combination of these output signals. For example, AND gate 2(0) receives OUT(3)-bar, OUT(4)-bar, and OUT(5)-bar, while AND gate 2(1) receives OUT(3), OUT(4)-bar, and OUT(5)-bar. When CSB is high, just one of the AND gates 2(0), 2(1), ..., 2(7) produces an active (high) output. When CSB is low, the outputs of all eight AND gates 2(0), 2(1), ..., 2(7) are inactive (low).

The outputs of the AND gates in pre-decoder 2a' activate different segments 3(0), ..., 3(7) of the X decoder 3. Each X-decoder segment has a plurality of word-line drivers, which may be configured as NAND gates, as indicated in the drawing. Each word-line driver receives the output of the corresponding AND gate in pre-decoder 2a', and a signal generated in pre-decoder 2b by decoding address bits AN$_1$IN and AN$_2$IN. The outputs of the X-decoder segments 3(0), ..., 3(7) drive the word lines in the memory cell array 1.

Figure 16:
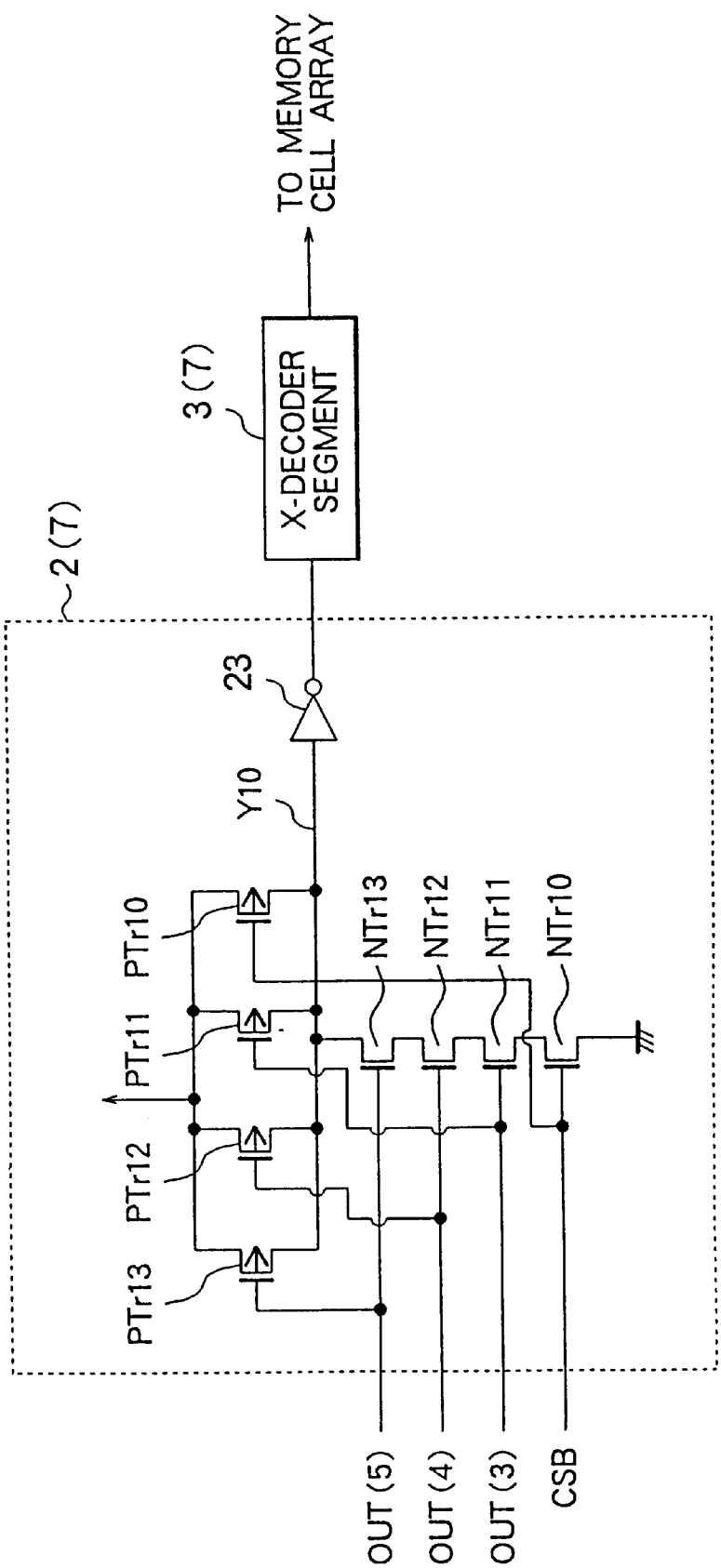
FIG. 16 is a circuit diagram illustrating one of the AND gates in FIG. 15.

FIG. 16 shows the structure of AND gate 2(7) in more detail. The p-channel transistors PTr10, PTr11, PTr12, and PTr13 and n-channel transistors NTr10, NTr11, NTr12, and NTr13 are interconnected so as to perform the NAND logic operation on control signal CSB and address buffer output signals OUT(3), OUT(4), and OUT(5). The NAND output Y10 is inverted by an inverter 23 to produce an AND output, which is supplied to X-decoder segment 3(7). The other AND gates in pre-decoder 2a' have similar structures.

The read control circuit 8 in the sixth embodiment operates in the same way as in the first embodiment, setting control signal CSB to the high level if a correct control code is input on address signal lines $AN_1IN$ and $AN_2IN$ while SEC is high and SECB is low.

If the control signal CSB output by the read control circuit 8 has been set to the high level, pre-decoder 2a' activates one of the segments of the X decoder 3, as selected by address signals $AN_3IN$, $AN_4IN$, and $AN_5IN$, and the activated segment drives one word line, as selected by address signals $AN_1IN$ and $AN_2IN$. Data are then read from memory cells coupled to the activated word line. If control signal CSB is low, however, then all segments of the X decoder 3 remain inactive, no word lines are driven, and no data can be read from the memory cell array 1.

An advantage of the sixth embodiment is that the control signal CSB only has to drive the gates of transistors PTr10 and NTr10 in FIG. 16, and the corresponding transistors in the other AND gates in pre-decoder 2a'. As these transistors are only used to perform logic operations, they are small in size, and present a smaller load to the CSB signal than the larger transistors employed in the sense-amplifier circuit 6 and output buffer circuit 7. The size of the latch 14 that generates the CSB signal can accordingly be smaller than in the first embodiment.

Another advantage is that the number of transistors to which the CSB signal is supplied is less in the sixth embodiment than in the first embodiment. Fewer signal lines are therefore required, and the size of the ROM device can be reduced.

Next, a seventh embodiment of the invention will be described.

Figure 17:
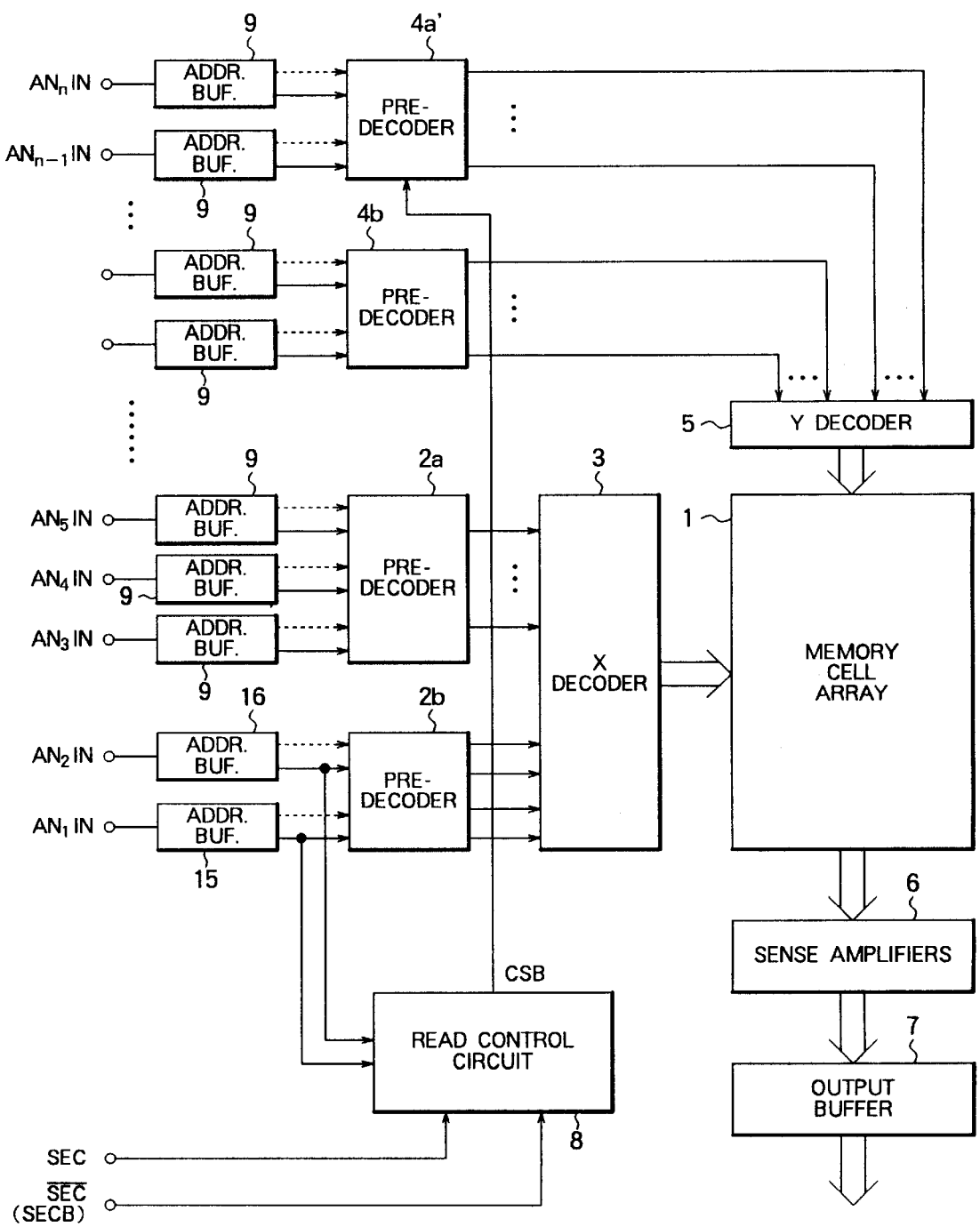
FIG. 17 is a block diagram of a mask-programmable ROM device illustrating a seventh embodiment of the invention.

FIG. 17 shows the block circuit configuration of the seventh embodiment. In the seventh embodiment, control signal CSB is supplied to pre-decoder 4a', the internal structure of which differs from the structure of pre-decoder 4a in the first embodiment, but resembles the structure of pre-decoder 2a' in the sixth embodiment.

Figure 18:
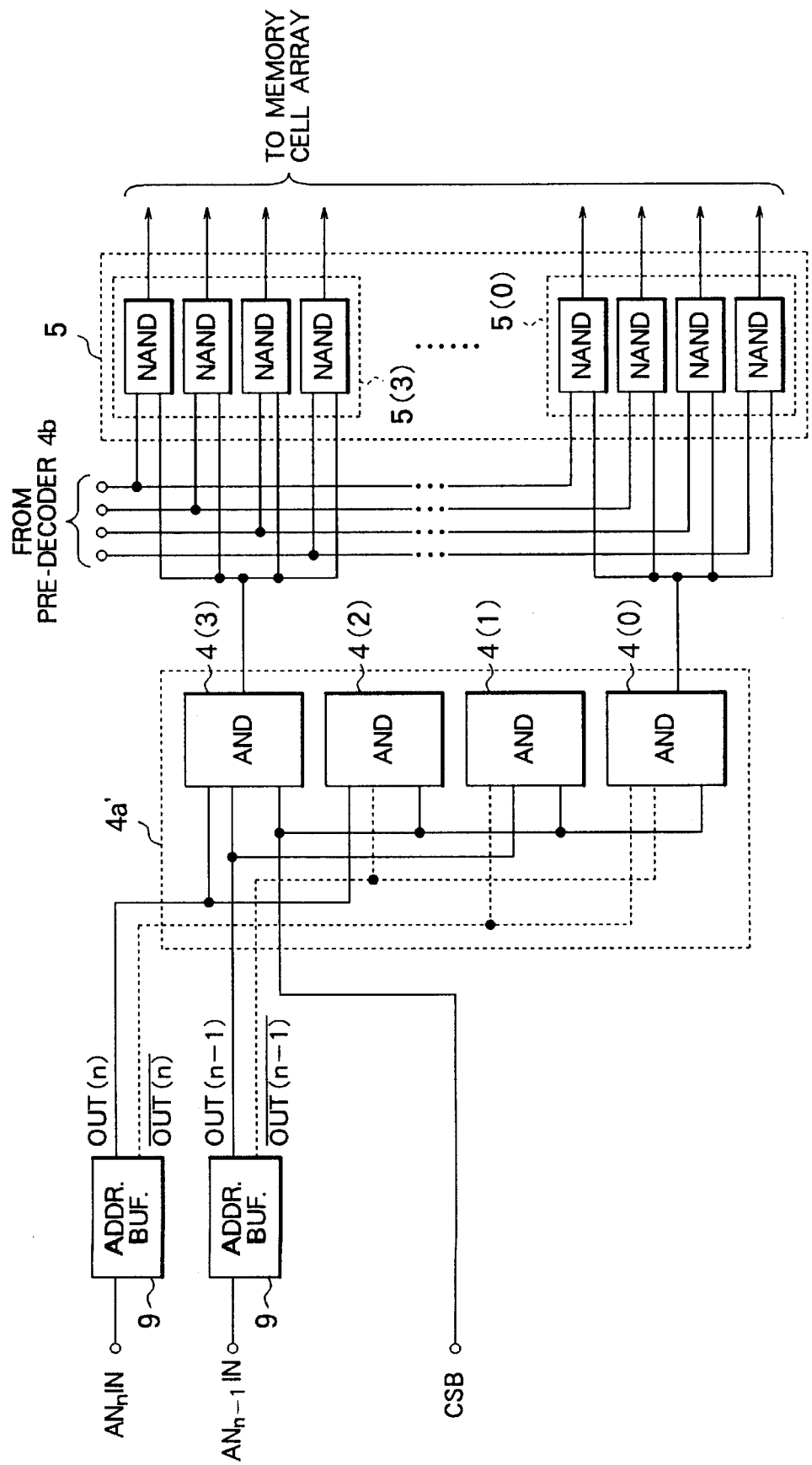
FIG. 18 is a more detailed block diagram of one of the pre-decoders in FIG. 17.

Referring to FIG. 18, pre-decoder 4a' comprises four AND gates 4(0), 4(1), 4(2), 4(3), each having one input terminal that receives control signal CSB from the read control circuit 8, and two input terminals coupled to the address buffers 9 that receive address signals $AN_{n-1}IN$, and $AN_nIN$. These two address buffers 9 produce respective output signals OUT(n-1) and OUT(n) having the same logic levels as $AN_{n-1}IN$ and $AN_nIN$, and complementary signals OUT(n-1)-bar and OUT(n)-bar. When CSB is high, just one of the AND gates 4(0), 4(1), 4(2), and 4(3) produces an active (high) output. When CSB is low, the outputs of all four AND gates 4(0), 4(1), 4(2), and 4(3) are inactive (low).

The outputs of the pre-decoder 4a' activate different segments 5(0), ..., 5(3) of the Y decoder 5. Each Y-decoder segment comprises a number of bit-line selectors, shown for illustrative purposes in the drawing as NAND gates. Each bit-line selector receives the output of the corresponding AND gate in pre-decoder 4a', and a signal generated in pre-decoder 4b by decoding address bits $AN_6IN$, ..., $AN_{n-2}IN$. The outputs of the Y-decoder segments 5(0), ..., 5(3) select bit lines in the memory cell array 1.

Figure 19:
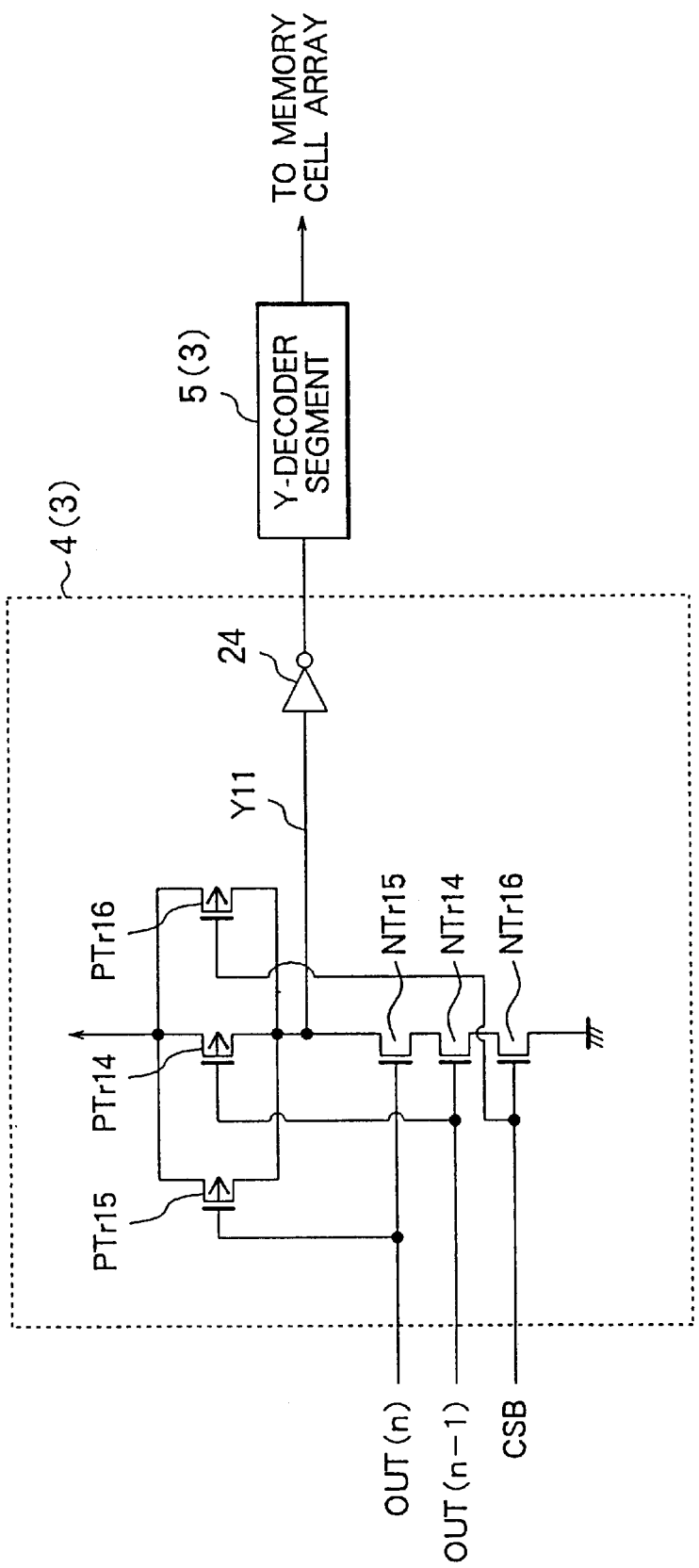
FIG. 19 is a circuit diagram illustrating one of the AND gates in FIG. 18.

FIG. 19 shows the structure of AND gate 4(3) in more detail. Three p-channel transistors PTr14, PTr15, and PTr16 and three n-channel transistors NTr14, NTr15, and NTr16 are interconnected to perform a NAND logic operation on control signals CSB and address buffer output signals OUT(n-1) and OUT(n). The NAND output Y11 is inverted by an inverter 24 to produce an AND output, which is supplied to Y-decoder segment 5(3).

The read control circuit 8 in the seventh embodiment operates in the same way as in the first embodiment, setting control signal CSB to the high level if a correct control code is input on address signal lines $AN_1IN$ and $AN_2IN$ while SEC is high and SECB is low.

If the control signal CSB output by the read control circuit 8 has been set to the high level, pre-decoder 4a' activates one of the segments of the Y decoder 5, as selected by address signals $AN_{n-1}IN$ and $AN_nIN$, and the activated segment selects one or more bit lines, according to address signals $AN_6IN$ to $AN_{n-2}IN$, causing data to be read from memory cells coupled to the selected bit lines. If control signal CSB is low, however, then all segments of the Y decoder 5 remain inactive, no bit lines are selected, and no data can be read from the memory cell array 1.

The seventh embodiment provides substantially the same effects as the sixth embodiment, but when pre-decoder 4a' has fewer address inputs than pre-decoder 2a, the seventh embodiment further reduces the load that must be driven by the CSB signal, permitting further reductions in circuit size.

Next, an eighth embodiment will be described. The eighth embodiment is an electrically programmable ROM device of the one-time programmable (OTP) type.

Figure 20:
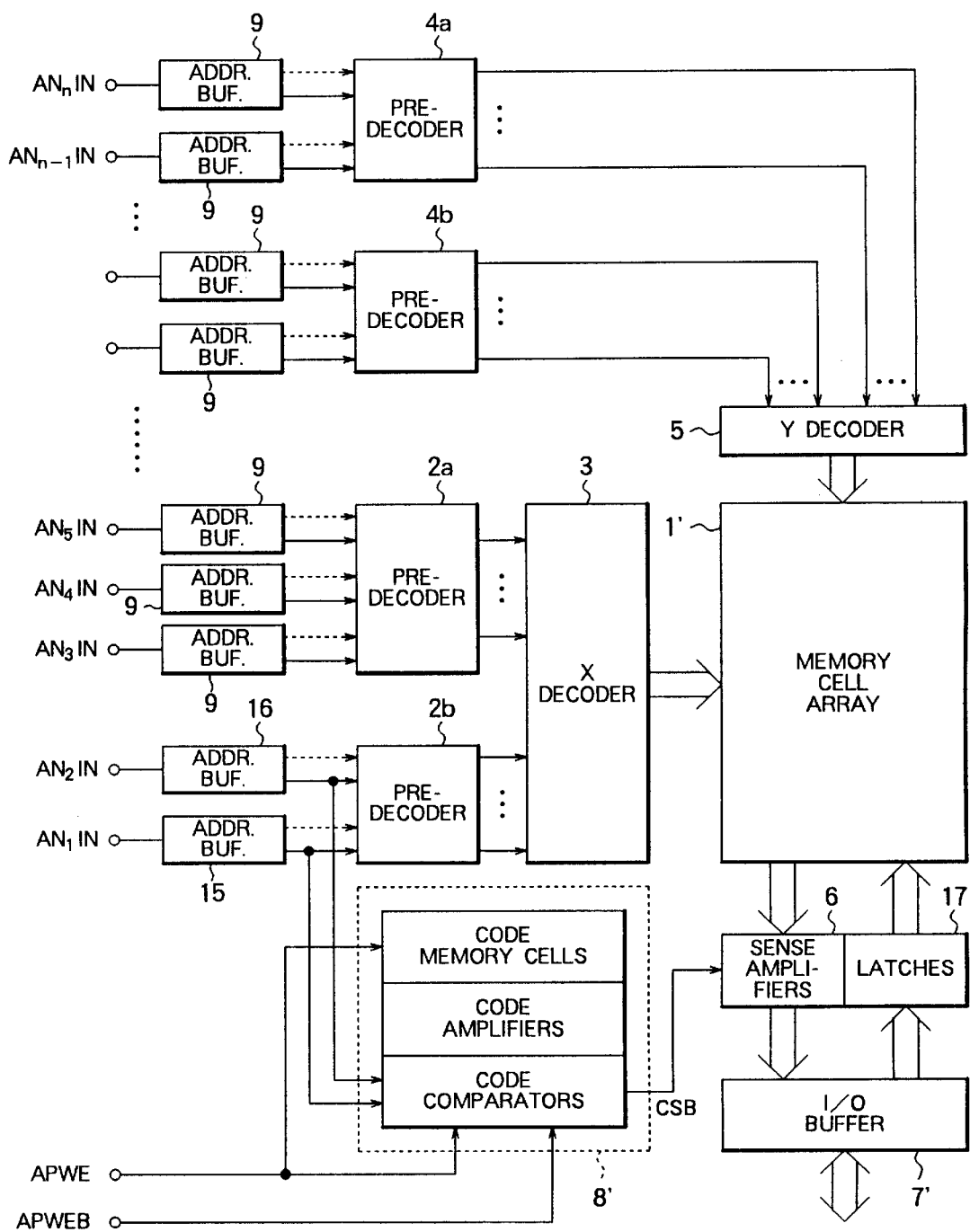
FIG. 20 is a block diagram of an electrically programmable ROM illustrating an eighth embodiment of the invention.

FIG. 20 shows the overall configuration of the eighth embodiment. The differences from the first embodiment are that the memory cell array 1' comprises memory cells that can be electrically programmed (the programmed data cannot be erased); the buffer circuit 7' is a bi-directional input/output (I/O) buffer circuit, and is not controlled by the CSB signal; the read control circuit 8' differs in structure from the read control circuit 8 of the first embodiment, and receives as mode signals a complementary pair of write-enable signals (APWE and APWEB) instead of the SEC and SECB signals of the first embodiment; and a plurality of latches 17 are provided, in addition to the sense amplifiers 6, between the I/O buffer circuit 7' and the memory cell array 1'. These latches 17 store input data being programmed into the memory cell array 1'.

Figure 21:
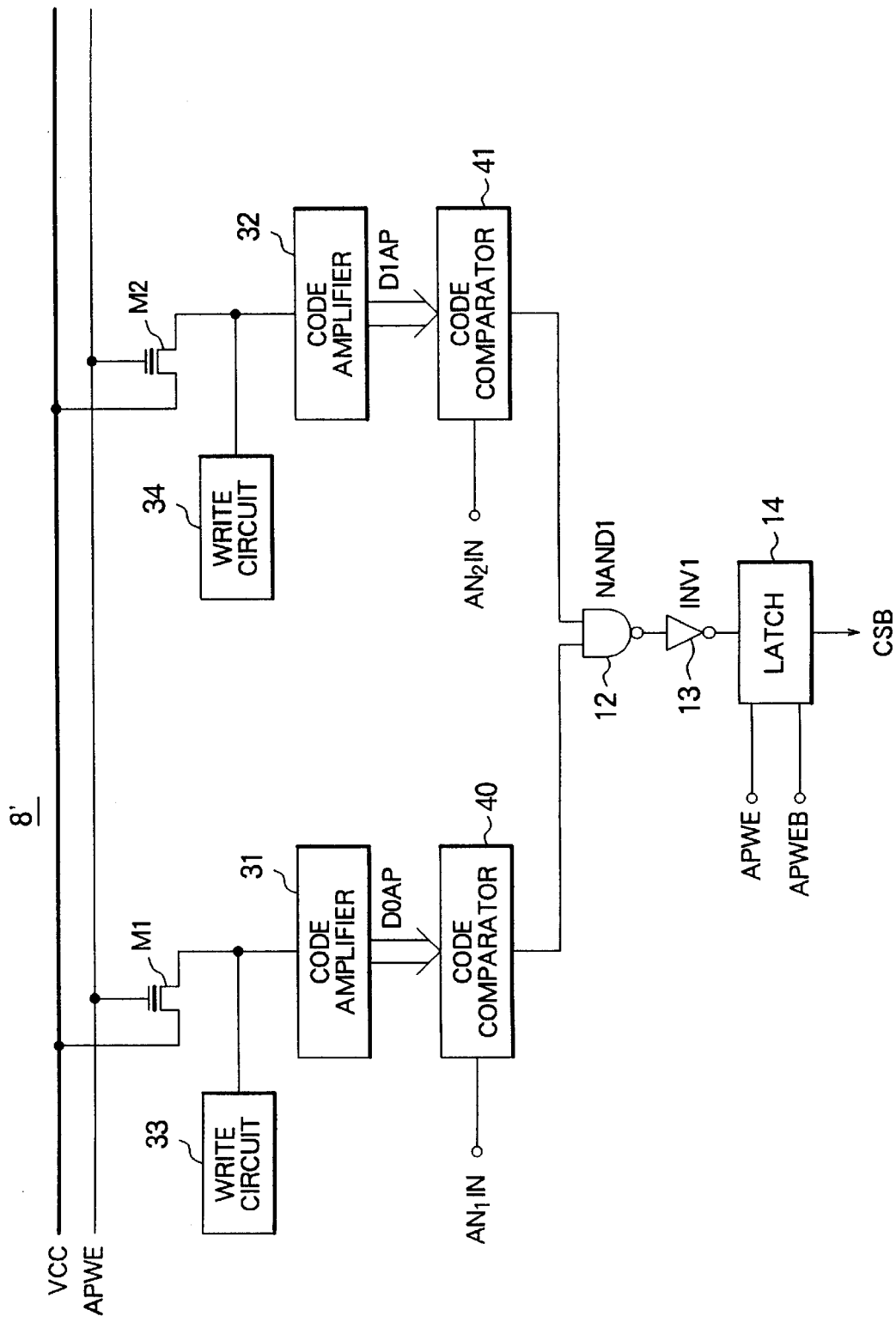
FIG. 21 is a more detailed block diagram of the read control circuit in FIG. 20.

Referring to FIG. 21, the read control circuit 8' has a pair of code memory cells M1 and M2. These memory cells are similar to the memory cells in the memory cell array 1'; each is, for example, a field-effect transistor with a source terminal coupled to a power supply line (VCC), a control gate coupled to the APWE signal line, and a floating gate disposed below the control gate. The drain terminals of memory cells M1 and M2 are coupled to respective code amplifiers 31 and 32, and to respective write circuits 33 and 34. The code amplifiers are similar to the sense amplifiers shown in FIG. 5, except that they are not controlled by the CSB signal. The write circuits 33 and 34 program the code memory cells M1 and M2 by transferring charge between their drain terminals and the floating gates.

The code memory cells M1 and M2 store security data similar to the security data programmed into the programmable comparators of the first embodiment.

Code amplifier 31 outputs amplified code data D0AP to code comparator 40, while code amplifier 32 outputs amplified code data D1AP to code comparator 41. The outputs of the code comparators 40 and 41 are combined by a NAND gate 12, then inverted by an inverter 13 and stored in a latch 14 as in the first embodiment, except that the latch 14 is controlled by the APWE and APWEB signals instead of by the SEC and SECB signals used in the first embodiment.

Figure 22:
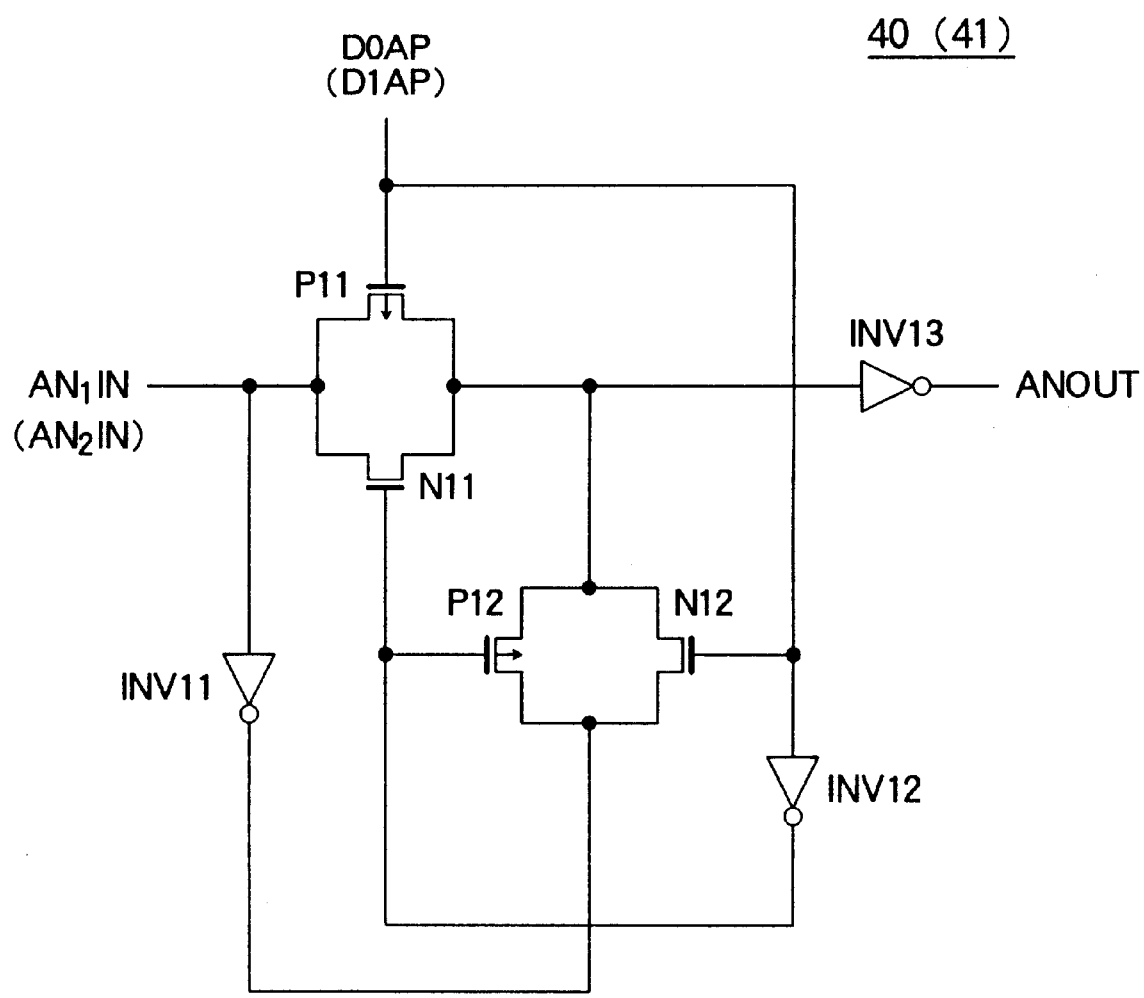
FIG. 22 is a circuit diagram illustrating one of the code comparators in FIG. 21.

Referring to FIG. 22, each of the code comparators 40 and 41 comprises a pair of p-channel transistors P11 and P12, a pair of n-channel transistors N11 and N12, and inverters INV11, INV12, and INV13. Transistors P11 and N11 are coupled in parallel, forming a transmission gate through which the input signal $AN_1IN$ or $AN_2IN$ is coupled to the input terminal of inverter INV3. Transistors P12 and N12 are likewise coupled in parallel, forming a transmission gate through which the output terminal of inverter INV11 is coupled to the input terminal of inverter INV13. These two transmission gates are controlled by the corresponding code amplifier output signal D0AP or D1AP, which is supplied to the gate terminals of transistors P11 and N12 and to inverter INV12. The inverted signal output by inverter INV12 is supplied to the gate terminals of transistors N11 and P12. The output of the code comparator is the output ANOUT of inverter INV13.

Code comparator 40 operates as shown in FIG. 23, which indicates various combinations of the security data stored in code memory cell M1, the input signal $AN_1IN$, the amplified code data signal D0AP, and the resulting output signal ANOUT. As in the first embodiment, the output signal is high if the input signal matches the security data, and low if the input signal does not match the security data. Code comparator 41 operates similarly.

Before an OTP ROM device according to the eighth embodiment is used, the memory cell array 1' is programmed with data. Methods of programming OTP ROM devices are well known, so a description will be omitted. In addition, a predetermined code is programmed into the code memory cells M1 and M2 in the read control circuit 8', by the same method as used to program the memory cell array 1'.

During use, when the OTP ROM device is powered on, the control signal CSB output from latch 14 is initially low, disabling the sense-amplifier circuit 6, thus preventing data from being read from the memory cell array 1'. To enable read access, an external device must place a control code matching the predetermined code on address signal lines $AN_1IN$ and $AN_2IN$, drive the APWE signal high and the APWEB signal low, then drive APWE low and APWEB high. These operations cause the comparison result signal output by inverter 13 to go high, and the high value to be latched and held in latch 14. The high CSB signal output by latch 14 then enables the sense-amplifier circuit 6, allowing data to be read from the memory cell array 1'. If the input control code does not match the predetermined code, CSB remains low, and read access to the ROM device remains disabled.

When the control code is used for security protection, the eighth embodiment has the advantage that the manufacturer of equipment in which the OTP ROM device is used can program the security data after accepting delivery from the OTP ROM manufacturer. The risk that an unintended party might learn the value of the security data is thus reduced.

Figure 24:
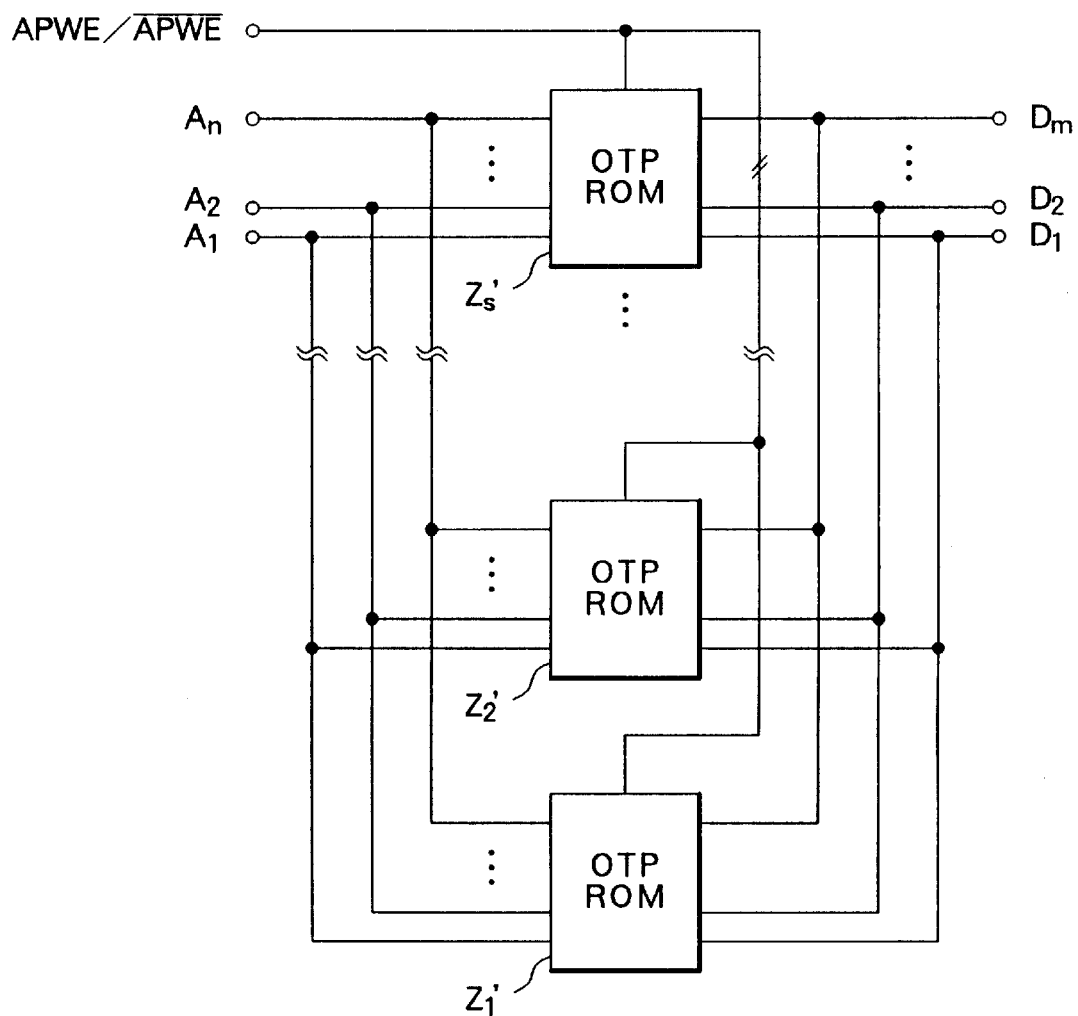
FIG. 24 is a block diagram illustrating a mode of usage of the eighth embodiment.

The control code can also be used to select one of several OTP ROM devices coupled to a common address bus, as in the first embodiment. Referring to FIG. 24, the APWE and APWEB signals are supplied to all of the OTP ROM devices $Z_1', Z_2', \ldots, Z_s'$, replacing the separate chip enable signals that would be required with conventional devices. A particular OTP ROM device is selected by placing the control code of that device on address signal lines $A_1$ and $A_2$, and driving APWE high, then low, while APWEB is simultaneously driven low, then high.

As in the first embodiment, the number of address signal lines used for input of the control code can be increased to provide a higher level of security, or enable more devices to be coupled to the same address bus. It is only necessary to increase the number of code memory cells, code amplifiers, and code comparators in the read control circuit 8'.

Next, a ninth embodiment will be described. The ninth embodiment is an OTP ROM device similar to the eighth embodiment except for the internal structure of the read control circuit 8'.

Figure 25:
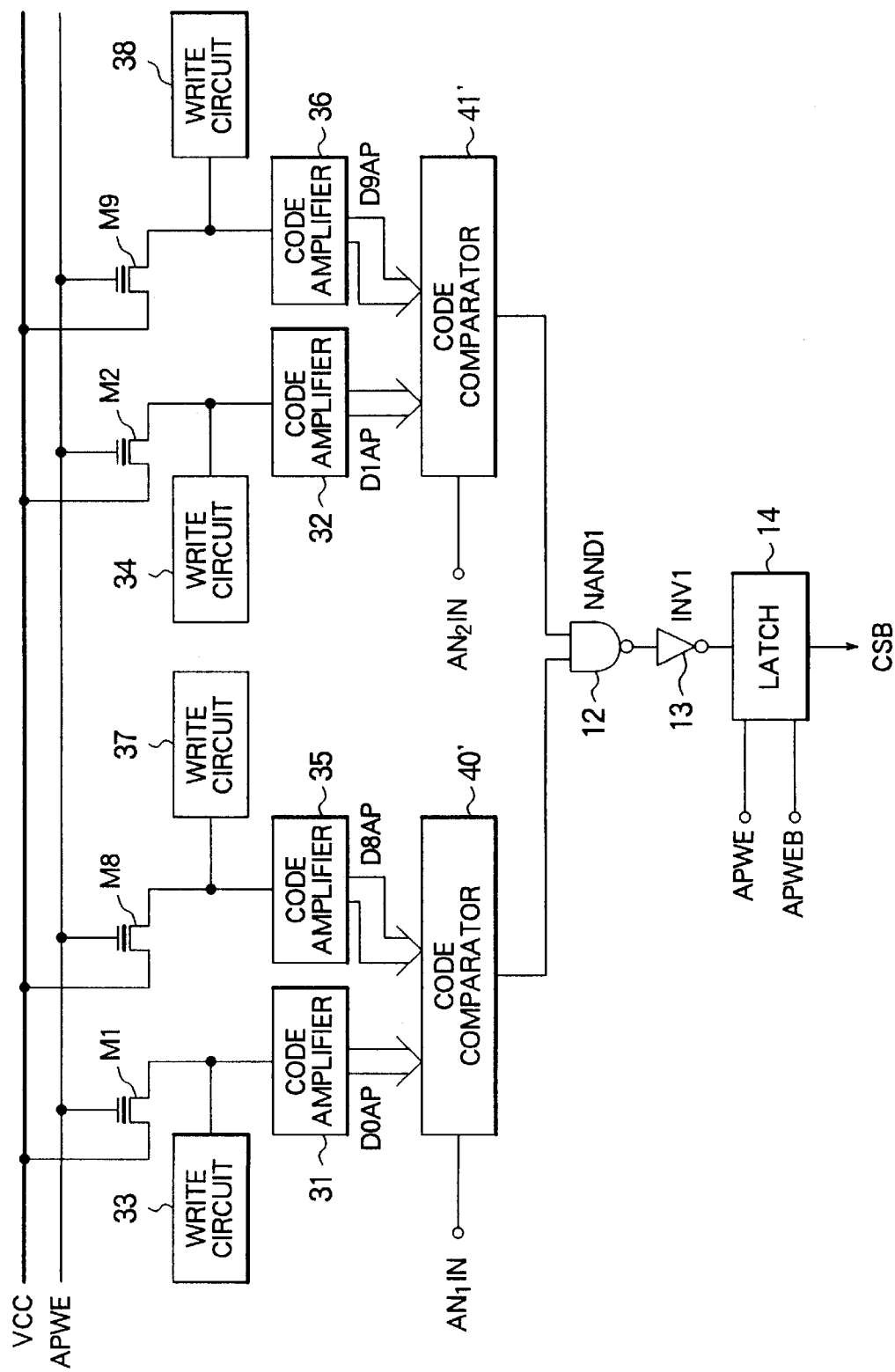
FIG. 25 is a block diagram of the read control circuit in a ninth embodiment of the invention.

Referring to FIG. 25, the read control circuit 8' in the ninth embodiment has four code memory cells M1, M2, M8, and M9. Memory cells M1 and M2 are used for storing security data as in the eighth embodiment. If read access is to be controlled according to the security data, high data are stored in memory cells M8 and M9. If read access is to be uncontrolled, low data are stored in memory cells M8 and M9. The read control circuit 8' has additional code amplifiers 35 and 36 and write circuits 37 and 38 for programming memory cells M8 and M9 and amplifying the programmed data. Code amplifiers 35 and 36 generate amplified code data D8AP and D9AP, respectively.

Figure 26:
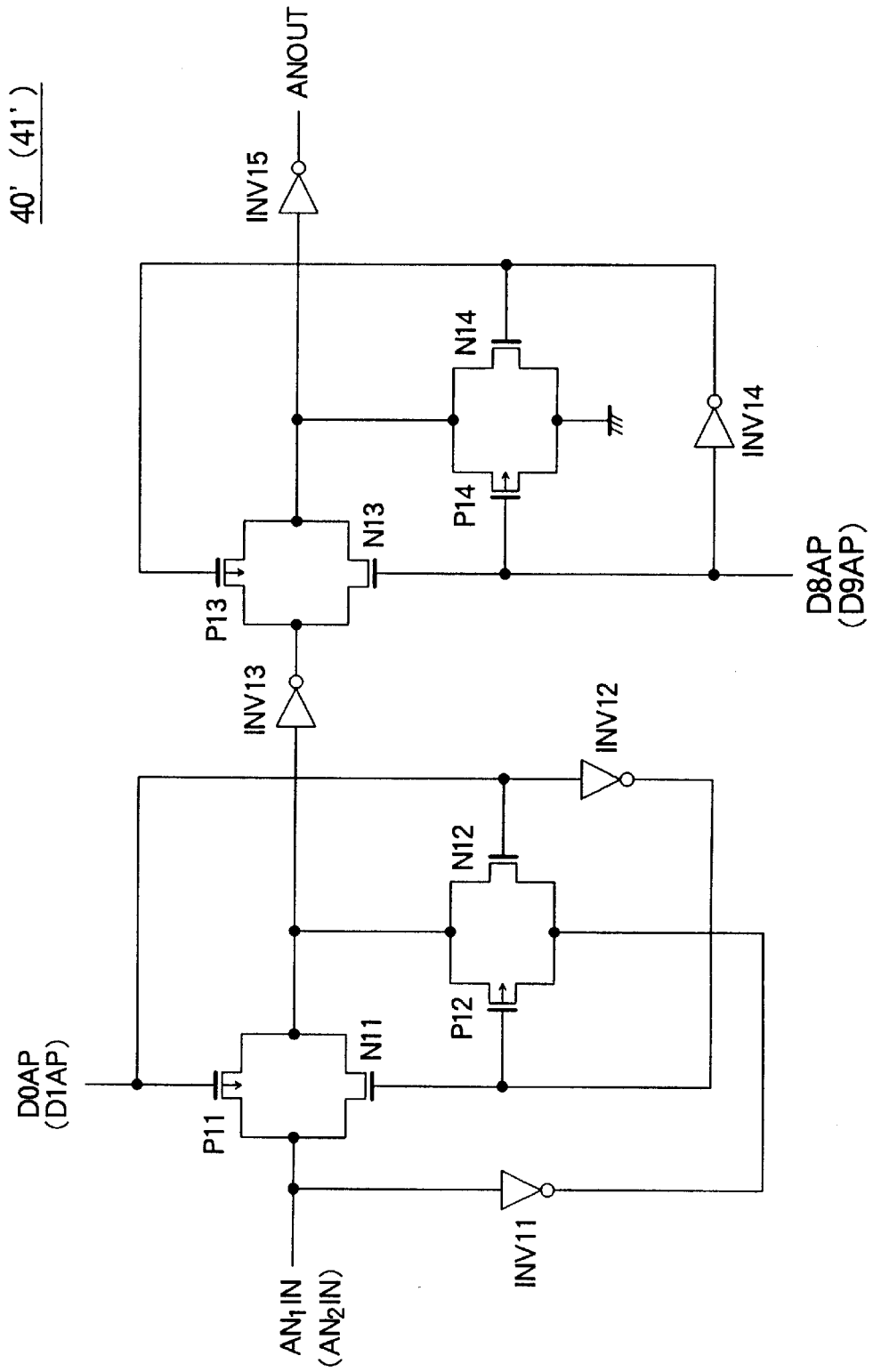
FIG. 26 is a circuit diagram illustrating one of the code comparators in FIG. 25.

Code comparator 40' receives the D0AP and D8AP signals from code amplifiers 31 and 35. Code comparator 41' receives the D1AP and D9AP signals from code amplifiers 32 and 36. Both code comparators 40' and 41' have the structure shown in FIG. 26, comprising p-channel transistors P11, P12, P13, and P14, n-channel transistors N11, N12, N13, and N14, and inverters INV11, INV12, INV13, INV14, and INV15. Transistors P11, P12, N11, and N12 and inverters INV11, INV12, and INV13 are interconnected in the same way as in the eighth embodiment.

Transistors P13 and N13 are connected in parallel to form a transmission gate through which the output terminal of inverter INV13 is coupled to the input terminal of inverter INV15. Transistors P14 and N14 are connected in parallel to form a transmission gate through which the input terminal of inverter INV15 is coupled to a ground node. These two transmission gates are controlled by the D8AP (or D9AP) signal. D8AP (or D9AP) is coupled to the gate terminals of transistors N13 and P14, and to the input terminal of inverter INV14; the output terminal of inverter INV14 is coupled to the gate terminals of transistors P13 and N14.

FIG. 27 indicates the operation of code comparator 40' for all combinations of the input signal $AN_1IN$ and the data stored in code memory cells M1 and M8. Signal D0AP represents the security data value stored in memory cell M1, while D8AP represents the value stored in memory cell M8. When D8AP is high, the output signal ANOUT is low if the input signal $AN_1IN$ matches D0AP, and high if $AN_1IN$ and D0AP do not match. When D8AP is low, the output signal ANOUT is high unconditionally.

The ninth embodiment combines the effects of the third and eighth embodiments. By programming the code memory cells M1, M2, M8, and M9, an equipment manufacturer using OTP ROM devices according to the ninth embodiment can select whether read access is to be controlled by a code or not, and program the necessary value of the control code if control is selected.

Next, a tenth embodiment will be described. The tenth embodiment is identical to the eighth embodiment, except that the control signal CSB is supplied to the I/O buffer circuit 7' instead of to the sense-amplifier circuit 6.

Figures 28, 29:
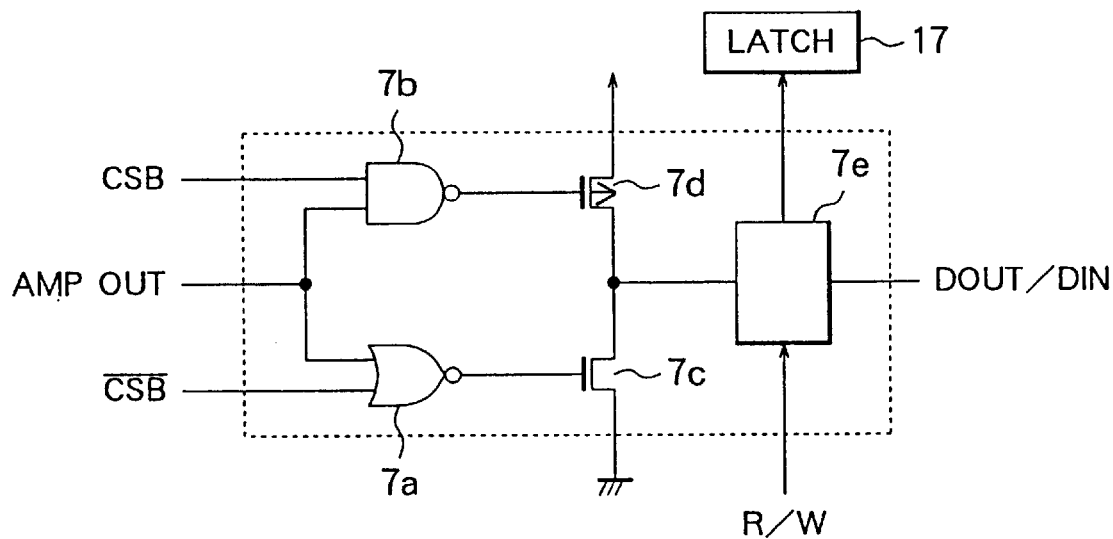
FIG. 28 is a circuit diagram illustrating one part of the input/output buffer circuit in a tenth embodiment of the invention.
FIG. 29 is a table illustrating the operation of the circuit in FIG. 28.

FIG. 28 shows a one-bit portion of the I/O buffer circuit 7', using the same reference numerals as in FIG. 6 for elements also found in the output buffer circuit 7 of the first embodiment. These elements are a NOR gate 7a, a NAND gate 7b, an n-channel transistor 7c, and a p-channel transistor 7d. An additional element is an input/output switch 7e controlled by a read/write (R/W) signal, which is generated from external control signals not explicitly shown in the drawings. The input-output switch 7e couples the drain terminals of transistors 7c and 7d to a data input/output terminal DOUT/DIN when the read/write signal designates the read state, and couples the input/output terminal DOUT/DIN to one of the latches 17 that stores data being programmed into the memory cell array 1' when the read/write signal designates the write state.

FIG. 29 illustrates the operation of this portion of the I/O buffer circuit 7' when the read state is designated. If the control signal CSB is low, then p-channel transistor 7d and n-channel transistor 7c are both switched off, and the output terminal DOUT/DIN is in the high-impedance (HiZ) state, regardless of the value of the signal AMP OUT received from sense amplifier 6. If the control signal CSB is high, then either transistor 7c or transistor 7d is switched on, and the input/output terminal DOUT/DIN reproduces the logic level of the AMP OUT signal, enabling data to be read from the memory cell array 1'.

The tenth embodiment provides effects similar to the eighth embodiment, but reduces the load driven by the control signal CSB, since the transistors in logic gates 7a and 7b in the I/O buffer circuit 7' are smaller than the transistors in the sense amplifiers. The size of the latch 14 in the read control circuit 8' can accordingly be reduced.

Next, an eleventh embodiment of the invention will be described.

Figure 30:
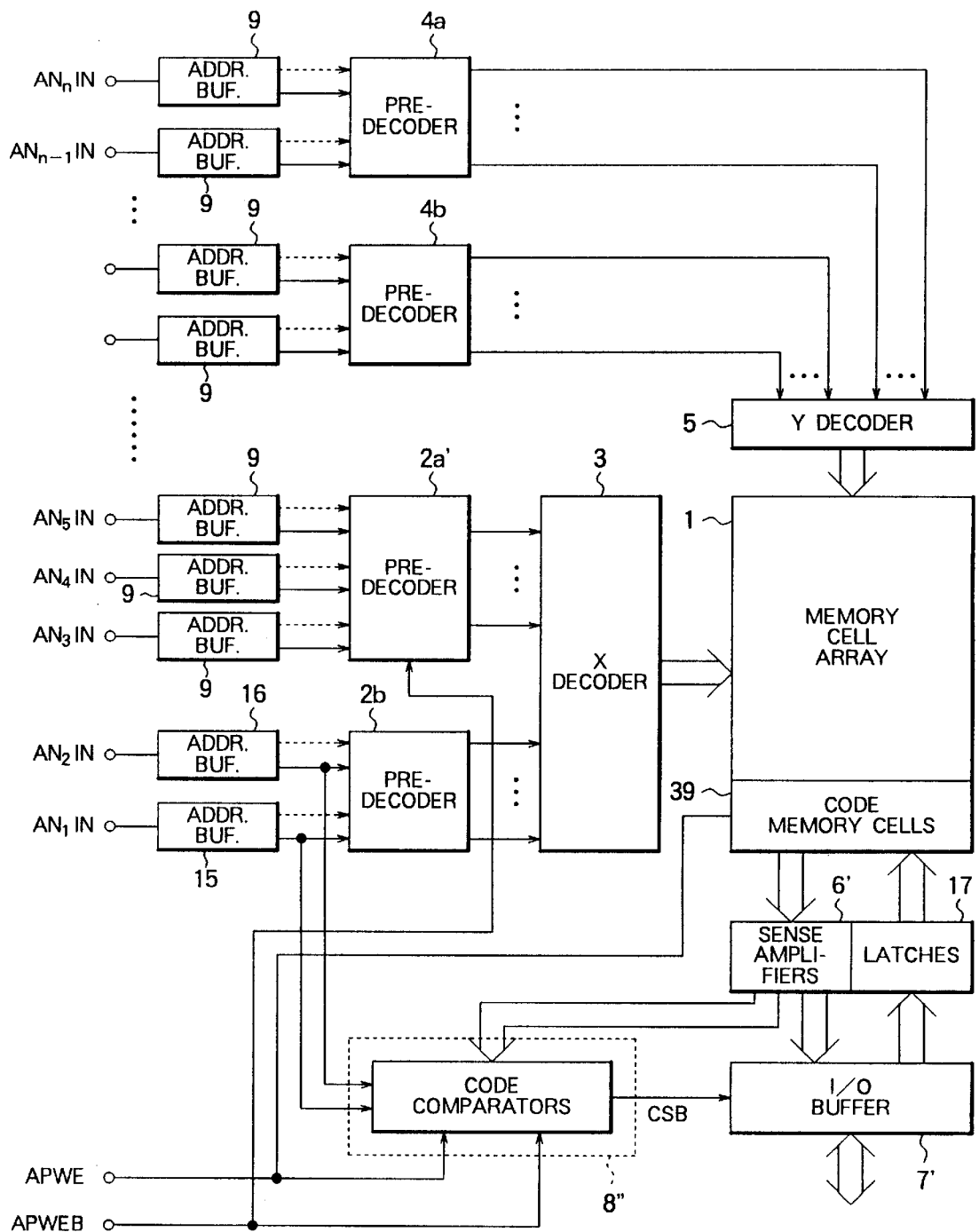
FIG. 30 is a block diagram of an electrically programmable ROM device illustrating an eleventh embodiment of the invention.

Referring to FIG. 30, the eleventh embodiment is an OTP ROM with a memory cell array 1" that includes both memory cells selected by the address signals, and additional code memory cells 39 for storing security data. The APWE signal line is used in the memory cell array 1" as an extra word line, to which the code memory cells 39 are connected. The APWEB signal is supplied to pre-decoder 2a' as an enabling signal. Pre-decoder 2a' has the same internal structure as in the sixth embodiment, the APWEB signal taking the place of the CSB signal in FIGS. 15 and 16.

The I/O buffer circuit 7' has the same structure as in the tenth embodiment, as shown in FIG. 28. The read control circuit 8" comprises the code comparators 40 and 41, NAND gate 12, inverter 13, and latch 14 of the eighth embodiment, shown in FIG. 21.

Security data are programmed into the code memory cells 39 in substantially the same way that ordinary data are programmed into the other memory cells in the memory cell array 1". During the programming of security data, the APWE signal is driven high to activate the word line on which the code memory cells 39 are disposed, and APWEB is driven low to prevent other word lines from being activated.

To enable the data stored in the other memory cells to be read, an external device drives the APWE signal to the high level and the APWEB signal to the low level, and places a control code matching the programmed security data on address signal lines $AN_1IN$ and $AN_2IN$. The sense-amplifier circuit 6 amplifies the data stored in the code memory cells 39, and supplies the amplified data to the read control circuit 8", which compares the amplified data values with the $AN_1IN$ and $AN_2IN$ values. If the compared values match, the CSB signal goes high, enabling the I/O buffer circuit 7', and remains high after APWE goes low and APWEB goes high.

During read access, APWE is held low, keeping the word line to which the code memory cells 39 are connected inactive, and APWEB is held high, enabling pre-decoder 2a'.

The eleventh embodiment provides the same effects as the tenth embodiment, with the further advantage that the code memory cells 39 are part of the memory cell array 1". The code memory cells 39 and other memory cells therefore tend naturally to have uniform electrical characteristics, which is an important consideration in the memory fabrication process. The eleventh embodiment also reduces the number of peripheral circuits that must be provided in addition to the memory cell array 1", because the code memory cells 39 are programmed and read using the same sense-amplifier circuit 6 and latches 17 as used for the other memory cells.

If necessary, the eleventh embodiment can be modified to prevent external reading of the security data stored in the code memory cells 39. For example, the I/O buffer circuit 7' can be controlled by both the APWE and CSB signals, the input/output terminals being placed in the high-impedance state unless CSB is high and APWE is low.

Next, a twelfth embodiment will be described.

Figure 31:
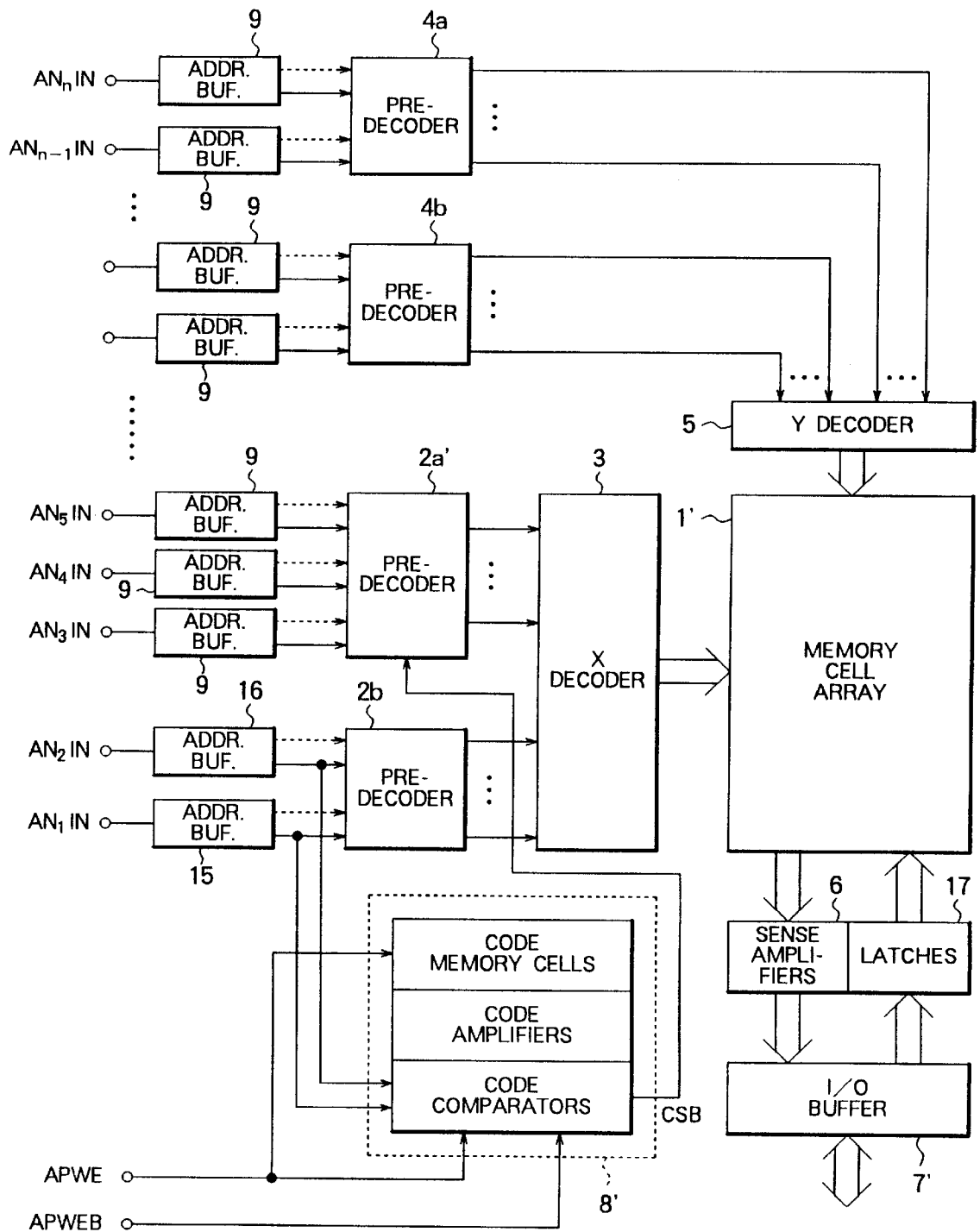
FIG. 31 is a block diagram of an electrically programmable ROM device illustrating a twelfth embodiment of the invention.

Referring to FIG. 31, the twelfth embodiment is similar to the eighth embodiment, except that the CSB signal output by the read control circuit 8' is supplied to pre-decoder 2a' instead of to the sense-amplifier circuit 6. Pre-decoder 2a' has the same internal structure as in the sixth embodiment, shown in FIGS. 15 and 16. As explained in the sixth embodiment, one output of pre-decoder 2a' is active when CSB is high, and all outputs of pre-decoder 2a' are inactive when CSB is low.

The operation of the twelfth embodiment can be understood from the description of the sixth and eighth embodiments. The twelfth embodiment provides the combined effects of the sixth and eighth embodiments. A particular advantage of the twelfth embodiment is that the risk that data stored in the memory cell array 1' might be altered by inadvertent programming is reduced, because no word lines in the memory cell array 1' are driven while the CSB signal is low.

Next, a thirteenth embodiment will be described.

Figure 32:
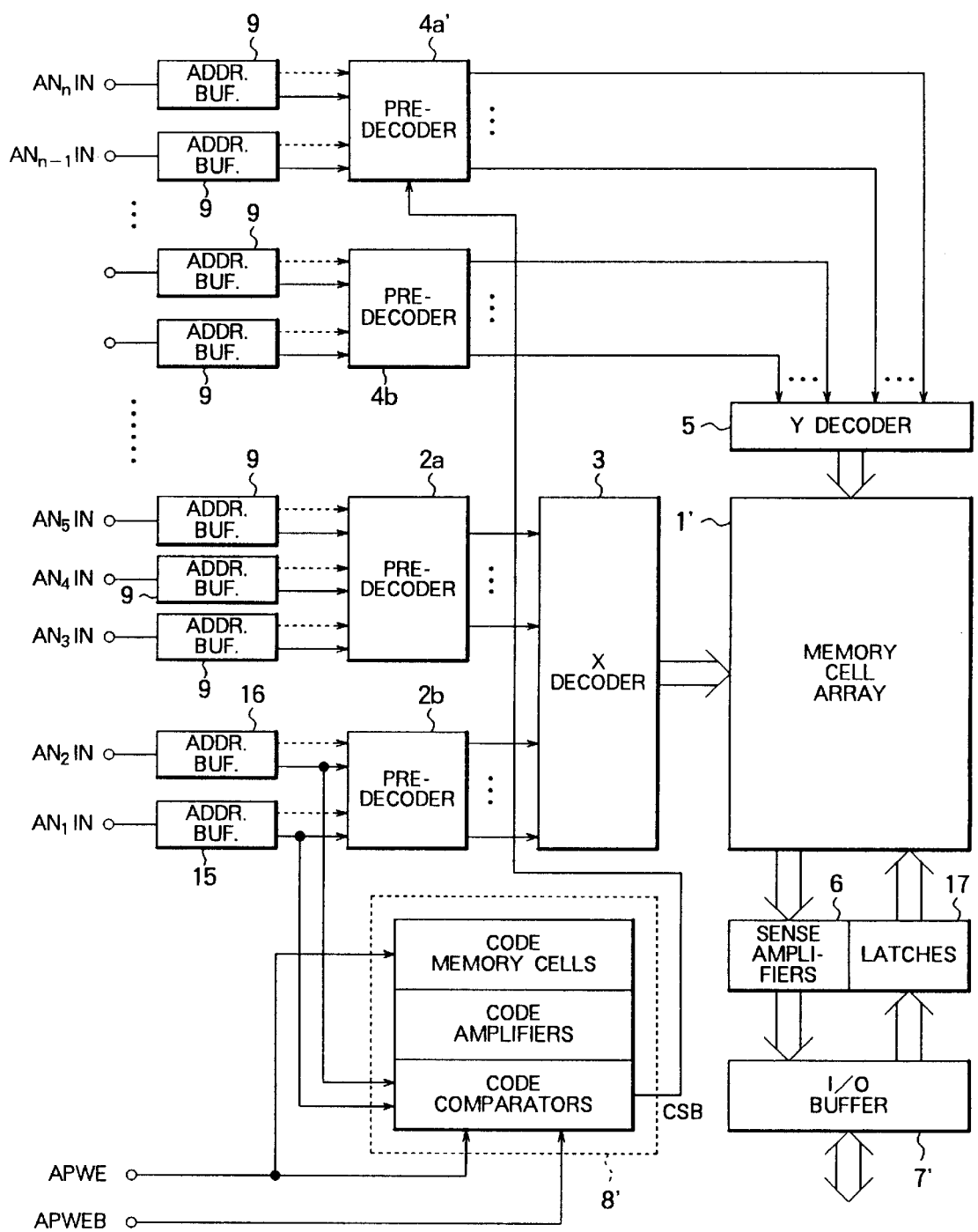
FIG. 32 is a block diagram of an electrically programmable ROM device illustrating a thirteenth embodiment of the invention.

Referring to FIG. 32, the thirteenth embodiment is similar to the eighth embodiment, except that the CSB signal output by the read control circuit 8' is supplied to pre-decoder 4a' instead of to the sense-amplifier circuit 6. Pre-decoder 4a' has the same internal structure as in the seventh embodiment, shown in FIGS. 18 and 19. As explained in the seventh embodiment, one output of pre-decoder 4a' is active when CSB is high, and all outputs of pre-decoder 4a' are inactive when CSB is low.

The operation of the thirteenth embodiment can be understood from the description of the seventh and eighth embodiments. The thirteenth embodiment provides the combined effects of the seventh and eighth embodiments.

Various combinations of the eighth to thirteenth embodiments are possible. For example, the CSB signal can be used to control pre-decoder 2a' as in the twelfth embodiment, and also to control the sense-amplifier circuit 6 and I/O buffer circuit 7', to reduce current consumption to a minimum when read access to the OTP ROM device is disabled. The circuits controlled by the CSB signal can be selected according to requirements concerning chip size, chip layout, interconnection pattern length, gate loads, and current consumption.

Storage of the security data in the memory cell array, as in the eleventh embodiment, is also possible in a mask-programmable ROM device.

Figure 33:
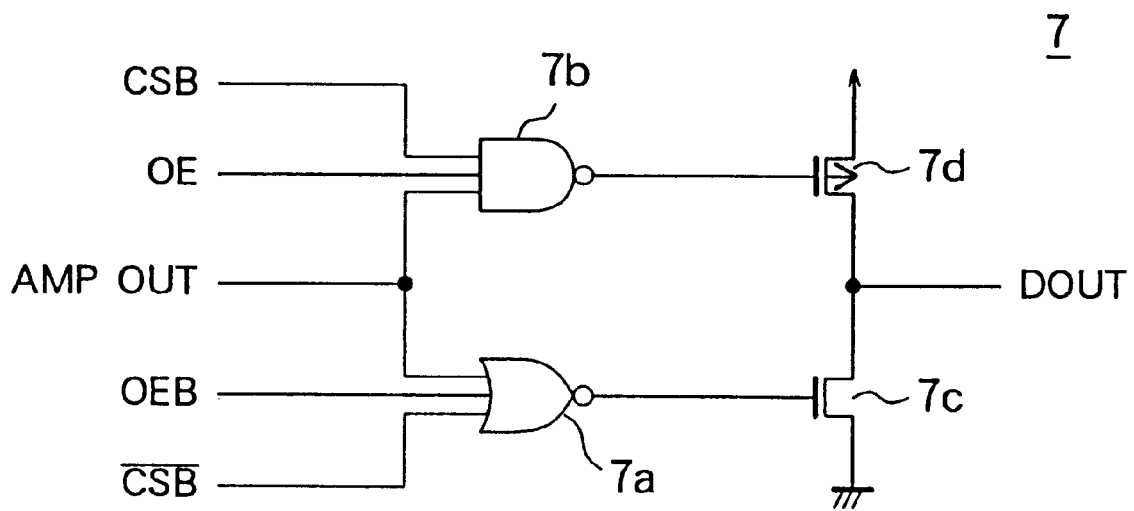
FIG. 33 is a circuit diagram of a modified output buffer circuit.

FIG. 33 illustrates a modification of the output buffer circuit 7 of the first embodiment, using the same reference numerals as in FIG. 6. The modification consists in supplying an output enable signal (OEB) as an additional input to NOR gate 7a, and supplying the complementary signal (OE) as an additional input to NAND gate 7b. When OEB is low and OE is high, this circuit operates in the same way as the circuit in FIG. 6. When OEB is high and OE is low, transistors 7c and 7d are both switched off, and the output buffer circuit 7 is in the high-impedance state, regardless of the state of the CSB control signal. If the invented ROM device is connected to the same data bus as, for example, a random-access memory (RAM) device, the output enable signal can be used to disable output from the ROM device while the RAM device is being accessed.

Similar modifications can be made to the output buffer circuits 7 used in the second to seventh embodiments, and the I/O buffer circuits 7' used in the OTP ROM devices in the eighth to thirteenth embodiments.

The invention has been described in relation to mask-programmable ROM and OTP ROM devices, but the invention can also be practiced in other types of memory devices, such as ultraviolet-erasable programmable read-only memory (EPROM), electrically erasable programmable read-only memory (EEPROM), and flash memory.

Those skilled in the art will recognize that further modifications are possible within the scope claimed below.

What is claimed is:

1. A memory device having a memory cell array with memory cells for storing data, comprising:
    a code input circuit that receives a control code generated externally of the memory device and that receives address signals, said address signals and said control code being received on identical signal lines;
    a mode input circuit that receives and provides a mode signal having one state indicating input of said address signals on said signal lines and another state indicating input of said control code on said signal lines;
    an address decoding circuit, coupled to said code input circuit, that selects said memory cells according to said address signals;
    a comparing circuit that compares said control code with a predetermined code and generates a comparison result signal; and
    a read control circuit controlling external read access to the data stored in the memory cells according to said comparison result signal and said mode signal.

2. The memory device of claim 1, wherein said read control circuit comprises a latch, controlled by said mode signal, that stores said comparison result signal, and said latch generates a control signal by which said read control circuit controls the external read access.

3. The memory device of claim 1, wherein said read control circuit controls the external read access by controlling said address decoding circuit.

4. A memory device having a memory cell array with memory cells for storing data, comprising:
    a sense-amplifier circuit that amplifies data read from the memory cells;
    a code input circuit that receives a control code generated externally of the memory device;
    a comparing circuit, coupled to said code input circuit, that compares said control code with a predetermined code and generates a comparison result signal; and
    a read control circuit, coupled to said comparing circuit and the memory cell array, that controls external read access to the data stored in the memory cells according to the comparison result signal, by controlling said sense-amplifier circuit.

5. A memory device having a memory cell array with memory cells for storing data, comprising:
    a buffer circuit that outputs data read from the memory cells;
    a code input circuit that receives a control code generated externally of the memory device;
    a comparing circuit, coupled to said code input circuit, that compares said control code with a predetermined code and generates a comparison result signal; and
    a read control circuit, coupled to said comparing circuit and the memory cell array, that controls external read access to the data stored in the memory cells according to the comparison result signal, by controlling said buffer circuit.

6. A memory device having a memory cell array with memory cells for storing data, comprising:
    a code input circuit that receives a control code generated externally of the memory device;
    a comparing circuit, coupled to said code input circuit, that compares said control code with a predetermined code and generates a comparison result signal; and
    a read control circuit, coupled to said comparing circuit and the memory cell array, that controls external read access to the data stored in the memory cells according to the comparison result signal,
    said comparing circuit including
        a first transmission gate receiving one bit of said control code,
        an inverter that inverts the one bit, thereby generating an inverted bit,
        a second transmission gate that receives the inverted bit, and
        a selecting circuit that enables only one of said first transmission gate and said second transmission gate, responsive to said predetermined code.

7. A memory device having a memory cell array with memory cells for storing data, comprising:
    a code input circuit that receives a control code generated externally of the memory device;
    a comparing circuit, coupled to said code input circuit and programmable to a first state and a second state, that compares said control code with a predetermined code and generates a comparison result signal in the first state; and
    a read control circuit, coupled to said comparing circuit and the memory cell array, that controls external read access to the data stored in the memory cells according to the comparison result signal when said comparing circuit is in the first state and that enables the external read access regardless of said control code when said comparing circuit is in the second state.
    said comparing circuit including
        a first transmission gate that receives one bit of said control code,
        an inverter that inverts the one bit, thereby generating an inverted bit,
        a second transmission gate that receives the inverted bit,
        a first selecting circuit that enables only one of said first transmission gate and said second transmission gate, responsive to said predetermined code,
        a third transmission gate that receives signals output from said first transmission gate and said second transmission gate,
        a fourth transmission gate that receives a fixed potential, and
        a second selecting circuit programmable to enable only one of said third transmission gate and said fourth transmission gate.

8. A memory device having a memory cell array with memory cells for storing data, comprising:
   a code input circuit that receives a control code generated externally of the memory device;
   a comparing circuit, coupled to said code input circuit, that compares said control code with a predetermined code stored in the memory cell array and that generates a comparison result signal;
   a sense-amplifier circuit, coupled to said comparing circuit, that amplifies the data read from the memory cells and that also amplifies said predetermined code; and
   a read control circuit, coupled to said comparing circuit and the memory cell array, that controls external read access to the data stored in the memory cells according to the comparison result signal.

9. The memory device of claim 8, wherein the memory cell array is electrically programmable.

10. A method of controlling read access to a memory device having address input terminals, comprising:
    storing a predetermined code in the memory device;
    sending a control code to the address input terminals;
    comparing the predetermined code with the control code inside the memory device, thereby obtaining a comparison result; and
    controlling read access to the memory device according to the comparison result.

11. The method of claim 11, further comprising:
    sending the memory device a mode signal distinguishing input of address signals at the address input terminals from input of the control code.

12. A method of controlling read access to a memory device having an address decoding circuit, comprising:
    storing a predetermined code in the memory device;
    sending a control code to the memory device;
    comparing the predetermined code with the control code inside the memory device, thereby obtaining a comparison result; and
    controlling read access to the memory device according to the comparison result by controlling the address decoding circuit.

13. A method of controlling read access to a memory device having a sense-amplifier circuit, comprising:
    storing a predetermined code in the memory device;
    sending a control code to the memory device;
    comparing the predetermined code with the control code inside the memory device, thereby obtaining a comparison result; and controlling read access to the memory device according to the comparison result by controlling the sense-amplifier circuit.

14. A method of controlling read access to a memory device having an output buffer circuit, comprising:
    storing a predetermined code in the memory device;
    sending a control code to the memory device;
    comparing the predetermined code with the control code inside the memory device, thereby obtaining a comparison result; and
    controlling read access to the memory device according to the comparison result by controlling the output buffer circuit.

* * * * *